(12) United States Patent
Taniguchi

(10) Patent No.: US 11,108,369 B2
(45) Date of Patent: Aug. 31, 2021

(54) BAND PASS FILTER

(71) Applicant: Murata Manufacturing Co., Ltd., Nagaokakyo (JP)

(72) Inventor: Tetsuo Taniguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/931,487

(22) Filed: Jul. 17, 2020

(65) Prior Publication Data

US 2021/0044269 A1  Feb. 11, 2021

Related U.S. Application Data

(63) Continuation of application No. PCT/JP2019/000849, filed on Jan. 15, 2019.

(30) Foreign Application Priority Data

Jan. 26, 2018  (JP) .............................. JP2018-011821
Mar. 27, 2018  (JP) .............................. JP2018-059718

(51) Int. Cl.
*H03H 7/01* (2006.01)
*H03H 7/09* (2006.01)
*H03H 1/00* (2006.01)

(52) U.S. Cl.
CPC ........ *H03H 7/0115* (2013.01); *H03H 7/0161* (2013.01); *H03H 7/09* (2013.01); *H03H 2001/0085* (2013.01)

(58) Field of Classification Search
CPC ........ H01P 1/20327; H03H 2001/0085; H03H 7/0115; H03H 7/09

USPC .................................................. 333/175, 185
See application file for complete search history.

(56) References Cited

U.S. PATENT DOCUMENTS

| 3,718,874 | A | * | 2/1973 | Cooper, Jr. | .......... | H03H 7/0161 333/204 |
| 6,414,567 | B2 | * | 7/2002 | Matsumura | ........... | H01P 1/2135 333/134 |
| 9,035,724 | B2 | * | 5/2015 | Imamura | ............. | H01P 1/20345 333/185 |

(Continued)

FOREIGN PATENT DOCUMENTS

| EP | 2 009 787 A1 | 12/2008 |
| JP | 63-318808 A | 12/1988 |
| JP | 05-14009 A | 1/1993 |

(Continued)

OTHER PUBLICATIONS

Official Communication issued in International Patent Application No. PCT/JP2019/000849, dated Mar. 19, 2019.

(Continued)

*Primary Examiner* — Rakesh B Patel
(74) *Attorney, Agent, or Firm* — Keating & Bennett, LLP

(57) ABSTRACT

A band pass filter is provided with a first filter circuit which includes a first resonant circuit including a first inductor and a second resonant circuit including a second inductor, a second filter circuit which includes a third resonant circuit including a third inductor and a fourth resonant circuit including a fourth inductor, and a fifth resonant circuit including a fifth inductor. The fifth inductor is electromagnetically coupled to each of the first inductor, the second inductor, the third inductor, and the fourth inductor.

18 Claims, 15 Drawing Sheets

(56) References Cited

U.S. PATENT DOCUMENTS

2012/0119852 A1  5/2012  Sasaki et al.
2013/0229241 A1  9/2013  Imamura

FOREIGN PATENT DOCUMENTS

| JP | 05-85120 U | 11/1993 |
| JP | 2005-045447 A | 2/2005 |
| JP | 2012-120149 A | 6/2012 |
| WO | 2007/119356 A1 | 10/2007 |
| WO | 2012/077498 A1 | 6/2012 |

OTHER PUBLICATIONS

Official Communication issued in corresponding Japanese Patent Application No. 2019-567004, dated Mar. 16, 2021.

* cited by examiner

BAND PASS FILTER

CROSS REFERENCE TO RELATED APPLICATIONS

This application claims the benefit of priority to Japanese Patent Application No. 2018-059718 filed on Mar. 27, 2018 and Japanese Patent Application No. 2018-011821 filed on Jan. 26, 2018, and is a Continuation Application of PCT Application No. PCT/JP2019/000849 filed on Jan. 15, 2019. The entire contents of each application are hereby incorporated herein by reference.

BACKGROUND OF THE INVENTION

1. Field of the Invention

The present invention relates to a band pass filter, and more particularly, to a band pass filter including a plurality of resonant circuits defined by an inductor and a capacitor.

2. Description of the Related Art

In the past, a high frequency band pass filter suitable for reduction in size and cost has been realized in that a plurality of resonant circuits defined by a capacitor and an inductor is formed in a multilayer body including a dielectric layer, a pattern conductor, and a via conductor. As an example of a band pass filter including a plurality of resonant circuits, a band pass filter described in International Publication No. 2007/119356 may be cited.

FIGS. 19A and 19B are explanatory diagrams of a band pass filter described in International Publication No. 2007/119356. FIG. 19A is an equivalent circuit diagram of a band pass filter 200. FIG. 19B is a filter characteristic chart of the band pass filter 200. S21 represents a bandpass characteristic with attenuation as an index. S11 represents a reflection characteristic with attenuation as the index.

As shown in FIG. 19A, the band pass filter 200 includes capacitors C211, C221, C231, and C241, inductors L211, L221, and L231, a first signal port P201, and a second signal port P202. The capacitor C211 and the inductor L211 define a resonant circuit. Similarly, the capacitor C221 and the inductor L221, the capacitor C231 and the inductor L231 define an independent resonant circuit, respectively. That is, the band pass filter 200 includes three stages of parallel resonant circuits.

In the band pass filter 200, electromagnetic field coupling as indicated by arrows is generated between the inductor L211 and the inductor L221, and between the inductor L221 and the inductor L231, respectively. As a result, as described in FIG. 19(B), S21 of the band pass filter 200 has attenuation poles of about −80 dB in a low frequency side and about −60 dB in a high frequency side relative to a pass band.

On the other hand, in the band pass filter 200, the absolute value of S21 in a frequency range lower than an attenuation pole on a low frequency side is significantly decreased compared with a value at the attenuation pole. Further, the absolute value of S21 in the frequency range higher than the attenuation pole on a high frequency side is also significantly decreased compared with the value at the attenuation pole, and a degree of the decrease gradually becomes larger accompanying an increase in the frequency.

SUMMARY OF THE INVENTION

Preferred embodiments of the present invention provide band pass filters that are each able to provide a sufficient attenuation characteristic even in a frequency range of the high frequency side and the low frequency side relative to a pass band.

In the band pass filters according to preferred embodiments of the present invention, a structure in which a plurality of resonant circuits are electromagnetically coupled to one another is able to be significantly improved.

A band pass filter according to a preferred embodiment of the present invention includes a first filter circuit, a second filter circuit, and a fifth resonant circuit.

The first filter circuit includes a first signal port, a first resonant circuit including a first inductor and a first capacitor, and a second resonant circuit including a second inductor and a second capacitor. The second filter circuit includes a second signal port, a third resonant circuit including a third inductor and a third capacitor, and a fourth resonant circuit including a fourth inductor and a fourth capacitor.

The fifth resonant circuit includes a fifth capacitor electrically connected to the ground, a sixth capacitor electrically connected to the ground, and a fifth inductor electrically connected between the fifth capacitor and the sixth capacitor. Then, the fifth inductor is electromagnetically coupled to each of the first inductor, the second inductor, the third inductor, and the fourth inductor.

A band pass filter according to a preferred embodiment of the present invention includes a first filter circuit, a second filter circuit, a fifth resonant circuit, and a sixth resonant circuit.

The first filter circuit includes a first signal port, a first resonant circuit including a first inductor and a first capacitor, and a second resonant circuit including a second inductor and a second capacitor. The second filter circuit includes a second signal port, a third resonant circuit including a third inductor and a third capacitor, and a fourth resonant circuit including a fourth inductor and a fourth capacitor.

The fifth resonant circuit includes a fifth capacitor electrically connected to the ground, a sixth capacitor electrically connected to the ground, and a fifth inductor electrically connected between the fifth capacitor and the sixth capacitor.

The sixth resonant circuit includes a seventh capacitor electrically connected to the ground, an eighth capacitor electrically connected to the ground, and a sixth inductor electrically connected between the seventh capacitor and the eighth capacitor.

The fifth inductor is electromagnetically coupled to each of the first inductor and the second inductor. In addition, the sixth inductor is electromagnetically coupled to each of the third inductor and the fourth inductor. Further, the fifth inductor and the sixth inductor are electromagnetically coupled to each other.

A band pass filter according to a preferred embodiment of the present invention includes a first filter circuit, a second filter circuit, and a seventh resonant circuit.

The first filter circuit includes a first signal port, a first resonant circuit including a first inductor and a first capacitor, and a second resonant circuit including a second inductor and a second capacitor. The second filter circuit includes a second signal port, a third resonant circuit including a third inductor and a third capacitor, and a fourth resonant circuit including a fourth inductor and a fourth capacitor.

The seventh resonant circuit includes a fifth capacitor electrically connected to the ground and a fifth inductor electrically connected between the ground and the fifth capacitor. The fifth inductor is electromagnetically coupled to each of the first inductor, the second inductor, the third inductor, and the fourth inductor.

A band pass filter according to a preferred embodiment of the present invention includes a first filter circuit, a second filter circuit, a seventh resonant circuit, and an eighth resonant circuit.

The first filter circuit includes a first signal port, a first resonant circuit including a first inductor and a first capacitor, and a second resonant circuit including a second inductor and a second capacitor. The second filter circuit includes a second signal port, a third resonant circuit including a third inductor and a third capacitor, and a fourth resonant circuit including a fourth inductor and a fourth capacitor.

The seventh resonant circuit includes a fifth capacitor electrically connected to the ground and a fifth inductor electrically connected between the ground and the fifth capacitor. The eighth resonant circuit includes a seventh capacitor electrically connected to the ground and a sixth inductor electrically connected between the ground and the seventh capacitor.

The fifth inductor is electromagnetically coupled to each of the first inductor and the second inductor. The sixth inductor is electromagnetically coupled to each of the third inductor and the fourth inductor. Further, the fifth inductor and the sixth inductor are electromagnetically coupled to each other.

A band pass filter according to a preferred embodiment of the present invention includes a multilayer body in which a plurality of dielectric layers are laminated, a plurality of pattern conductors provided between layers of the dielectric layers, and a plurality of via conductors penetrating through the dielectric layers. The band pass filter includes a first filter circuit, a second filter circuit, and a fifth resonant circuit.

The first filter circuit includes a first signal electrode, a first ground electrode, a first resonant circuit including a first inductor and a first capacitor, and a second resonant circuit including a second inductor and a second capacitor. The first signal electrode, the first ground electrode, the first resonant circuit, and the second resonant circuit are defined by the pattern conductors or by the pattern conductors and the via conductors.

The second filter circuit includes a second signal electrode, a second ground electrode, a third resonant circuit including a third inductor and a third capacitor, and a fourth resonant circuit including a fourth inductor and a fourth capacitor. The second signal electrode, the second ground electrode, the third resonant circuit, and the fourth resonant circuit are defined by the pattern conductors or by the pattern conductors and the via conductors.

The fifth resonant circuit includes a third ground electrode, a fifth capacitor, a sixth capacitor, and a fifth inductor. The fifth capacitor and the sixth capacitor are electrically connected to the third ground electrode. The fifth inductor is electrically connected between the fifth capacitor and the sixth capacitor. The fifth resonant circuit is defined by the pattern conductors or by the pattern conductors and the via conductors.

The fifth resonant circuit is in parallel between the first filter circuit and the second filter circuit as follows. That is, a virtual plane, on which the fifth inductor is provided, is referred to as a first plane. When the first inductor and the second inductor are projected onto the first plane, at least a portion of the first inductor and at least a portion of the second inductor overlap with the fifth inductor.

Further, when the third inductor and the fourth inductor are projected onto the first plane, at least a portion of the third inductor and at least a portion of the fourth inductor overlap with the fifth inductor.

A band pass filter according to a preferred embodiment of the present invention includes a multilayer body in which a plurality of dielectric layers are laminated, a plurality of pattern conductors provided between layers of the dielectric layers, and a plurality of via conductors penetrating through the dielectric layers. The band pass filter includes a first filter circuit, a second filter circuit, a fifth resonant circuit, and a sixth resonant circuit. The first filter circuit, the second filter circuit, and the fifth resonant circuit are the same as or similar to the first filter circuit, the second filter circuit, and the fifth resonant circuit in the band pass filter according to other preferred embodiments of the present invention, respectively.

The sixth resonant circuit includes a fourth ground electrode, a seventh capacitor, an eighth capacitor, and a sixth inductor. The seventh capacitor and the eighth capacitor are electrically connected to the fourth ground electrode. The sixth inductor is electrically connected between the seventh capacitor and the eighth capacitor. The sixth resonant circuit is defined by the pattern conductors or by the pattern conductors and the via conductors.

The fifth resonant circuit and the sixth resonant circuit are in parallel between the first filter circuit and the second filter circuit as follows. That is, a virtual plane, on which the fifth inductor is provided, is referred to as a first plane. When the first inductor and the second inductor are projected onto the first plane, at least a portion of the first inductor and at least a portion of the second inductor overlap with the fifth inductor.

Further, a virtual plane, on which the sixth inductor is provided, is referred to as a second plane. When the third inductor and the fourth inductor are projected onto the second plane, at least a portion of the third inductor and at least a portion of the fourth inductor overlap with the sixth inductor.

Further, when the sixth inductor is projected onto the first plane, at least a portion of the sixth inductor overlaps with the fifth inductor.

A band pass filter according to a preferred embodiment of the present invention includes a multilayer body in which a plurality of dielectric layers are laminated, a plurality of pattern conductors provided between layers of the dielectric layers, and a plurality of via conductors penetrating through the dielectric layers. The band pass filter includes a first filter circuit, a second filter circuit, and a seventh resonant circuit. The first filter circuit and the second filter circuit are the same as or similar to the first filter circuit and the second filter circuit in the band pass filter according to other preferred embodiments of the present invention, respectively.

The seventh resonant circuit includes a third ground electrode, a fifth capacitor, and a fifth inductor. The fifth capacitor is electrically connected to the third ground electrode. The fifth inductor is electrically connected between the third ground electrode and the fifth capacitor. The seventh resonant circuit is defined by the pattern conductors or by the pattern conductors and the via conductors.

The fifth inductor is electromagnetically coupled to each of the first inductor, the second inductor, the third inductor, and the fourth inductor.

A band pass filter according to a preferred embodiment of the present invention includes a multilayer body in which a plurality of dielectric layers are laminated, a plurality of pattern conductors provided between layers of the dielectric layers, and a plurality of via conductors penetrating through the dielectric layers. The band pass filter includes a first filter circuit, a second filter circuit, a seventh resonant circuit, and an eighth resonant circuit. The first filter circuit, the second filter circuit, and the seventh resonant circuit are the same as or similar to the first filter circuit, the second filter circuit, and the seventh resonant circuit in the band pass filter according to other preferred embodiments of the present invention, respectively.

The eighth resonant circuit includes a fourth ground electrode, a seventh capacitor, and a sixth inductor. The seventh capacitor is electrically connected to the fourth ground electrode. The sixth inductor is electrically connected between the fourth ground electrode and the seventh capacitor. The eighth resonant circuit is defined by the pattern conductors or by the pattern conductors and the via conductors.

The fifth inductor is electromagnetically coupled to each of the first inductor and the second inductor. The sixth inductor is electromagnetically coupled to each of the third inductor and the fourth inductor. Further, the fifth inductor and the sixth inductor are electromagnetically coupled to each other.

A band pass filter according to a preferred embodiment of the present invention includes a first filter circuit, a second filter circuit, and an intermediate circuit provided in a multilayer body including a plurality of dielectric layers and a plurality of conductor layers. The intermediate circuit includes a ground conductor provided in any of conductor layers; a first capacitor conductor and a second capacitor conductor that are provided in any of conductor layers and face the ground conductor with the dielectric layer provided therebetween; a first line conductor that is provided in any of the conductor layers; and a first via conductor and a second via conductor that are provided in a lamination direction of the multilayer body. The first capacitor conductor and the first line conductor are electrically connected through the first via conductor. The second capacitor conductor and the first line conductor are electrically connected through the second via conductor. In addition, in a direction orthogonal or substantially orthogonal to the lamination direction, the first filter circuit, the intermediate circuit, and the second filter circuit are provided side by side in this order. The first filter circuit and the intermediate circuit are electromagnetically coupled, and the second filter circuit and the intermediate circuit are electromagnetically coupled.

Here, "the first filter circuit and the intermediate circuit are electromagnetically coupled" means that an inductor defining the first filter circuit and an inductor defining the intermediate circuit are electromagnetically coupled to each other. Similarly, "the second filter circuit and the intermediate circuit are electromagnetically coupled" means that an inductor defining the second filter circuit and an inductor defining the intermediate circuit are electromagnetically coupled to each other.

Band pass filters according to preferred embodiments of the present invention are each able to provide a sufficient attenuation characteristic even in a frequency range of a high frequency side or a low frequency side relative to a pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
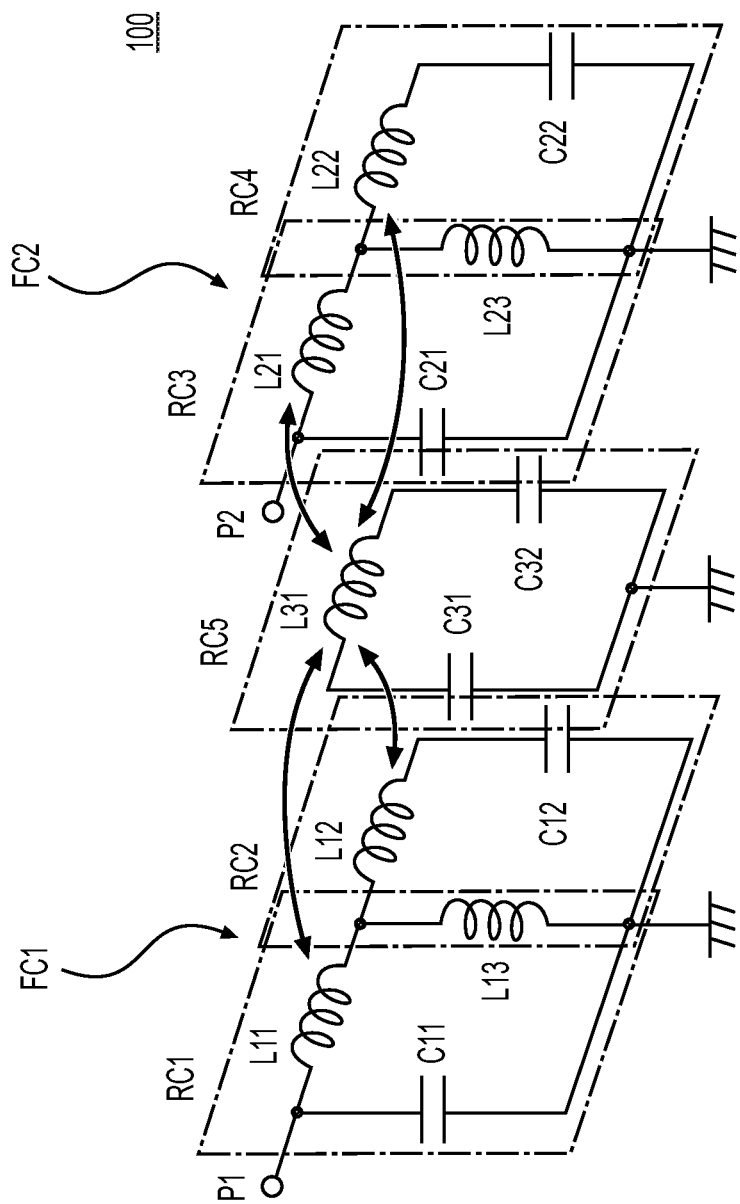
FIG. 1 is an equivalent circuit diagram of a band pass filter 100 which is a first preferred embodiment of a band pass filter according to the present invention.

Hereinafter, preferred embodiments of the present invention will be described, and features of the present invention will be further described in detail below with reference to the drawings. Examples of the band pass filter to which the present invention is applied include a multilayer ceramic filter provided by co-firing a low temperature fired ceramic, a pattern conductor and a via conductor, but are not limited thereto.

First Preferred Embodiment of Band Pass Filter

A band pass filter 100 which is a first preferred embodiment of the band pass filter according to the present invention will be described with reference to FIG. 1 to FIG. 3.

An exploded perspective view, which will be described later, is a schematic view. For example, thicknesses of a dielectric layer and a pattern conductor, a diameter of a via conductor, and the like are schematic. Further, variations in the shapes of respective elements occurring in a manufacturing process are not necessarily reflected in the drawings.

FIG. 1 is an equivalent circuit diagram of the band pass filter 100. The band pass filter 100 includes a first filter circuit FC1, a second filter circuit FC2, and a fifth resonant circuit RC5.

The first filter circuit FC1 includes a first signal port P1, a first resonant circuit RC1, and a second resonant circuit RC2. The first resonant circuit RC1 includes a first inductor L11, a first capacitor C11, and a seventh inductor L13 shared with the second resonant circuit RC2. The second resonant circuit RC2 includes a second inductor L12, a second capacitor C12, and the seventh inductor L13 shared with the first resonant circuit RC1. The seventh inductor L13 is not a necessary element, and may be omitted.

In the first resonant circuit RC1, the first inductor L11 and the seventh inductor L13 are electrically connected in series between the first signal port P1 and the ground. The first capacitor C11 is electrically connected between the first signal port P1 and the ground in parallel with the first inductor L11 and the seventh inductor L13.

In the second resonant circuit RC2, the second inductor L12 and the second capacitor C12 are electrically connected in series between the first inductor L11 and the ground. The seventh inductor L13 is electrically connected between the first inductor L11 and the ground in parallel with the second inductor L12 and the second capacitor C12.

The second filter circuit FC2 includes a second signal port P2, a third resonant circuit RC3, and a fourth resonant circuit RC4. The third resonant circuit RC3 includes a third inductor L21, a third capacitor C21, and an eighth inductor L23 shared with the fourth resonant circuit RC4. The fourth resonant circuit RC4 includes a fourth inductor L22, a fourth capacitor C22, and the eighth inductor L23 shared with the third resonant circuit RC3. The eighth inductor L23 is not a necessary element, and may be omitted.

In the third resonant circuit RC3, the third inductor L21 and the eighth inductor L23 are electrically connected in series between the second signal port P2 and the ground. The third capacitor C21 is electrically connected between the second signal port P2 and the ground in parallel with the third inductor L21 and the eighth inductor L23.

In the fourth resonant circuit RC4, the fourth inductor L22 and the fourth capacitor C22 are electrically connected in series between the third inductor L21 and the ground. The eighth inductor L23 is electrically connected between the third inductor L21 and the ground in parallel with the fourth inductor L22 and the fourth capacitor C22.

The fifth resonant circuit RC5 includes a fifth capacitor C31, a sixth capacitor C32, and a fifth inductor L31. The fifth capacitor C31 and the sixth capacitor C32 are electrically connected to the ground, respectively. The fifth inductor L31 is electrically connected between the fifth capacitor C31 and the sixth capacitor C32.

The fifth inductor L31 is electromagnetically coupled to each of the first inductor L11, the second inductor L12, the third inductor L21, and the fourth inductor L22.

Figure 2:
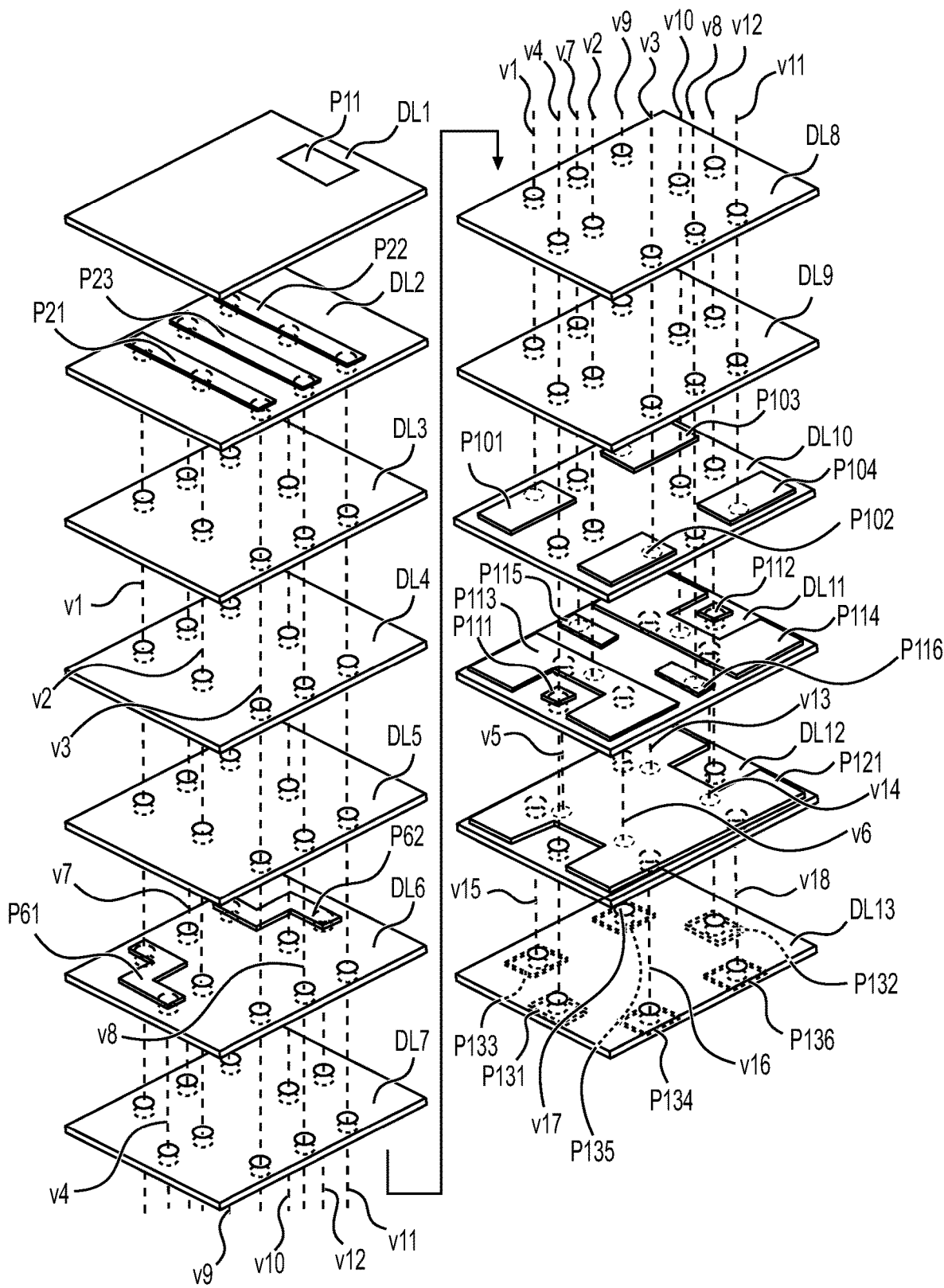
FIG. 2 is an exploded perspective view of the band pass filter 100.

FIG. 2 is an exploded perspective view of the band pass filter 100. The band pass filter 100 includes a multilayer body formed by laminating dielectric layers DL1 to DL13, a plurality of pattern conductors provided between layers of the dielectric layers, and a plurality of via conductors penetrating through the dielectric layers. The plurality of pattern conductors and the plurality of via conductors will be described later. The first filter circuit FC1, the second filter circuit FC2, and the fifth resonant circuit RC5 are defined by the dielectric layers, the pattern conductors, and the via conductors. Although a direction mark P11 is provided on the dielectric layer DL1 in FIG. 2, this is not necessary.

The first filter circuit FC1 is defined by pattern conductors P21, P61, P101, P102, P111, and P113 and the via conductors. The rectangular or substantially rectangular pattern conductor P21 is provided on the dielectric layer DL2. The bent plate-shaped pattern conductor P61 is provided on the dielectric layer DL6. The rectangular or substantially rectangular pattern conductors P101 and P102 are provided on the dielectric layer DL10. The rectangular or substantially rectangular pattern conductor P111 and the angular substantially C-shaped pattern conductor P113 are provided on the dielectric layer DL11. Each of the plurality of via conductors is provided in the dielectric layers DL2 to DL11.

The first filter circuit FC1 includes a first signal electrode (first terminal electrode P131 which will be described later), a first ground side capacitor electrode which will be described later, the first resonant circuit RC1, and the second resonant circuit RC2.

The pattern conductor P21 is electrically connected to the pattern conductors P61 and P101 through a via conductor v1. The pattern conductor P21 is electrically connected to the pattern conductor P113 through a via conductor v2. The pattern conductor P21 is electrically connected to the pattern conductor P102 through a via conductor v3. The pattern conductor P61 is electrically connected to the pattern conductors P111 and P131 through a via conductors v4.

The pattern conductor P111 is electrically connected to the first terminal electrode P131 through the via conductor v4. The first inductor L11 is defined by a portion of the pattern conductor P21 (portion from the connection point with the via conductor v1 to the connection point with the via conductor v2) and the via conductor v1. The seventh inductor L13 is defined by the via conductor v2 that electrically connects the pattern conductor P21 and the pattern conductor P113. As described above, the seventh inductor L13 is not an essential element. That is, the seventh inductor L13 may also be provided by inductive coupling of the first inductor L11 and the second inductor L12 which will be described later.

The first capacitor C11 is defined by the pattern conductor P101 and the pattern conductor P113. The pattern conductor P113 is a ground side capacitor electrode (referred to as "first ground side capacitor electrode") common to the first capacitor C11 and the second capacitor C12 which will be described later. The first terminal electrode P131 corresponds to the first signal port P1 in FIG. 1. Although not shown in FIG. 1, the pattern conductor P61 is a pattern conductor electrically connected to the first signal port P1.

Thus, the first resonant circuit RC1 is defined by the first inductor L11, the seventh inductor L13, and the first capacitor C11.

The second inductor L12 is defined by a portion of the pattern conductor P21 (portion from the connection point with the via conductor v2 to the connection point with the via conductor v3) and the via conductor v3. The second capacitor C12 is defined by the pattern conductor P102 and the pattern conductor P113.

As described above, the first capacitor C11 and the second capacitor C12 share the pattern conductor P113. The pattern conductor P113 is electrically connected to a pattern conductor P121, which is a ground electrode, through via conductors v5 and v6 provided in the dielectric layer DL11 to the dielectric layer DL12. The pattern conductor P121 will be described later.

Thus, the second resonant circuit RC2 is defined by the second inductor L12, the seventh inductor L13, and the second capacitor C12.

The second filter circuit FC2 is defined by pattern conductors P22, P62, P103, P104, P112, and P114 and the via conductors. The rectangular or substantially rectangular pattern conductor P22 is provided on the dielectric layer DL2. The bent plate-shaped pattern conductor P62 is provided on the dielectric layer DL6. The rectangular or substantially rectangular pattern conductors P103 and P104 are provided on the dielectric layer DL10. The rectangular or substantially rectangular pattern conductor P112 and the angular substantially C-shaped pattern conductor P114 are provided on the dielectric layer DL11. Each of the plurality of via conductors is provided in the dielectric layers DL2 to DL11.

The second filter circuit FC2 includes a second signal electrode (second terminal electrode P132 which will be described later), a second ground side capacitor electrode which will be described later, and the third resonant circuit RC3 and the fourth resonant circuit RC4.

The pattern conductor P22 is electrically connected to the pattern conductors P62 and P103 through a via conductor v9. The pattern conductor P22 is electrically connected to the pattern conductor P114 through a via conductor v10. The pattern conductor P22 is electrically connected to the pattern conductor P104 through a via conductor v11. The pattern conductor P62 is electrically connected to the pattern conductors P112 and P132 through a via conductor v12.

The pattern conductor P112 is electrically connected to the second terminal electrode P132 through the via conductor v12. The third inductor L21 is defined by a portion of the pattern conductor P22 (portion from the connection point with the via conductor v9 to the connection point with the via conductor v10) and the via conductor v9. The seventh inductor L13 is defined by the via conductor v10 that electrically connects the pattern conductor P22 and the pattern conductor P114. As described above, the eighth inductor L23 is not an essential element. That is, the eighth inductor L23 may also be provided by inductive coupling of the third inductor L21 and the fourth inductor L22 which will be described later.

The third capacitor C21 is defined by the pattern conductor P103 and the pattern conductor P114. The pattern conductor P114 is a ground side capacitor electrode (referred to as "second ground side capacitor electrode") common to the third capacitor C21 and the fourth capacitor C22. The fourth capacitor C22 will be described later. The second terminal electrode P132 corresponds to the second signal port P2 in FIG. 1. Although not shown in FIG. 1, the pattern conductor P62 is a pattern conductor electrically connected to the second signal port P2.

Thus, the third resonant circuit RC3 is defined by the third inductor L21, the eighth inductor L23, and the third capacitor C21.

The fourth inductor L22 is defined by a portion of the pattern conductor P22 (portion from the connection point with the via conductor v10 to the connection point with the via conductor v11) and the via conductor v11. The fourth capacitor C22 is defined by the pattern conductor P104 and the pattern conductor P114.

As described above, the third capacitor C21 and the fourth capacitor C22 share the pattern conductor P114. The pattern conductor P114 is electrically connected to the pattern conductor P121, which is the ground electrode, through via conductors v13 and v14 formed in the dielectric layer DL11 to the dielectric layer DL12. The pattern conductor P121 will be described later.

Thus, the fourth resonant circuit RC4 is defined by the fourth inductor L22, the eighth inductor L23, and the fourth capacitor C22.

The fifth resonant circuit RC5 is defined by the ground electrode, the fifth capacitor C31, the sixth capacitor C32, and the fifth inductor L31 electrically connected between the fifth capacitor C31 and the sixth capacitor C32. The ground electrode is the pattern conductor P121. The pattern conductor P121 is electrically connected to a third terminal electrode P133 through a via conductor v15 formed in the dielectric layers DL12 to DL13. The pattern conductor P121 is electrically connected to a fourth terminal electrode P134 through a via conductor v16 formed in the dielectric layers DL12 to DL13. The pattern conductor P121 is electrically connected to a fifth terminal electrode P135 through a via conductor v17 formed in the dielectric layers DL12 to DL13. The pattern conductor P121 is electrically connected to a sixth terminal electrode P136 through a via conductor v18 formed in the dielectric layers DL12 to DL13.

The fifth capacitor C31 is defined by a pattern conductor P115 and the pattern conductor P121. The sixth capacitor C32 is defined by a pattern conductor P116 and the pattern conductor P121. That is, the fifth capacitor C31 and the sixth capacitor C32 share the pattern conductor P121. The fifth inductor L31 is defined by a pattern conductor P23, and via conductors v7 and v8 formed in the dielectric layers DL2 to DL11. The via conductors v7 and v8 are electrically connected to both end portions of the pattern conductor P23.

The fifth resonant circuit RC5 is in parallel between the first filter circuit FC1 and the second filter circuit FC2 as follows. The virtual plane, on which the pattern conductor P23 and the respective via conductors electrically connected to both end portions thereof are provided, is referred to as a first plane. The pattern conductor P23 and the via conductors electrically connected to both end portions thereof define the fifth inductor L31. That is, the first plane refers to a plane including a central section along the central axes of respective via conductors and a longitudinal direction of the pattern conductor P23, considering manufacturing errors.

When the first inductor L11 and the second inductor L12 are projected onto the first plane, the first inductor L11 and the second inductor L12 overlap with the fifth inductor L31. Further, when the third inductor L21 and the fourth inductor L22 are projected onto the first plane, the third inductor L21 and the fourth inductor L22 overlap with the fifth inductor L31.

Accordingly, the fifth inductor L31 is electromagnetically coupled to each of the first inductor L11, the second inductor L12, the third inductor L21, and the fourth inductor L22 as indicated by arrows in FIG. 1.

In the band pass filter 100 shown in FIG. 2, the entire first inductor L11 and the entire second inductor L12 overlap with the fifth inductor L31, respectively. The entire third inductor L21 and the entire fourth inductor L22 overlap with the fifth inductor L31, respectively. It is sufficient that at least a portion of each of the first inductor L11, the second inductor L12, the third inductor L21, and the fourth inductor L22 overlaps with the fifth inductor L31.

For example, the pattern conductor P23 may be longer than or shorter than the pattern conductor P21 and the pattern conductor P22. Further, in order to adjust the electromagnetic field coupling between the fifth inductor L31 and each of the first inductor L11, the second inductor L12, the third inductor L21, and the fourth inductor L22, the dielectric layer on which the pattern conductor P23 is provided may be different from the dielectric layer on which the pattern conductor P21 and the pattern conductor P22 are provided. For example, by providing the pattern conductor P23 on the dielectric layer DL3, a partial coupling state between coils is provided, and therefore, the electromagnetic field coupling between the coils is able to be significantly reduced. By providing the pattern conductor P23 on the dielectric layer DL3, electromagnetic field coupling is able to be provided without increasing the physical dimensions of the pattern conductors P21 to P23.

Figure 3:
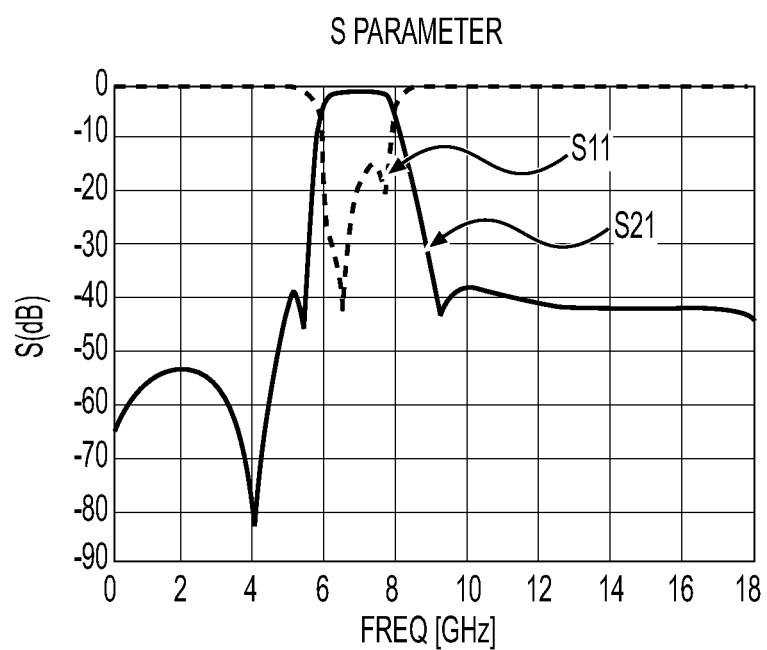
FIG. 3 is a filter characteristic chart of the band pass filter 100.

In FIG. 3, described is the filter characteristic of the band pass filter 100 when the capacitance of each capacitor and the inductance of each inductor are set to a predetermined value. Focusing on S21 of the filter characteristic, there are attenuation poles of about −83 dB in a low frequency side and about −44 dB in a high frequency side relative to a pass band.

Figure 19A:
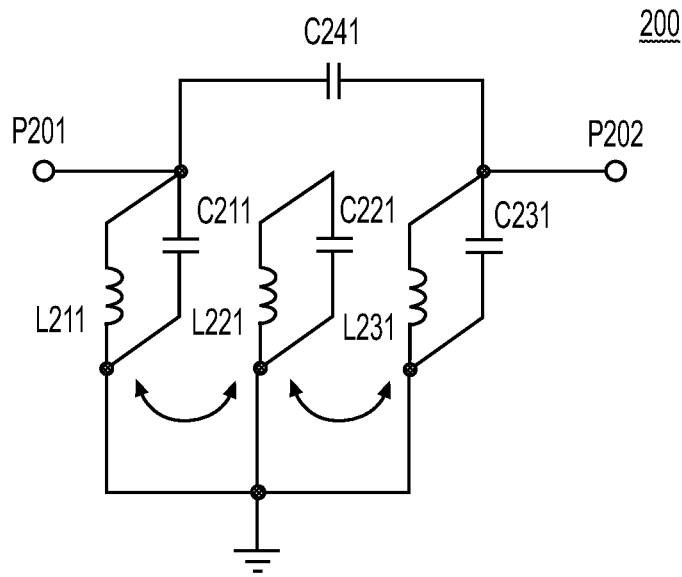
FIGS. 19A and 19B are equivalent circuit diagrams and a filter characteristic chart of a band pass filter 200 of the background art.
Figure 19B:
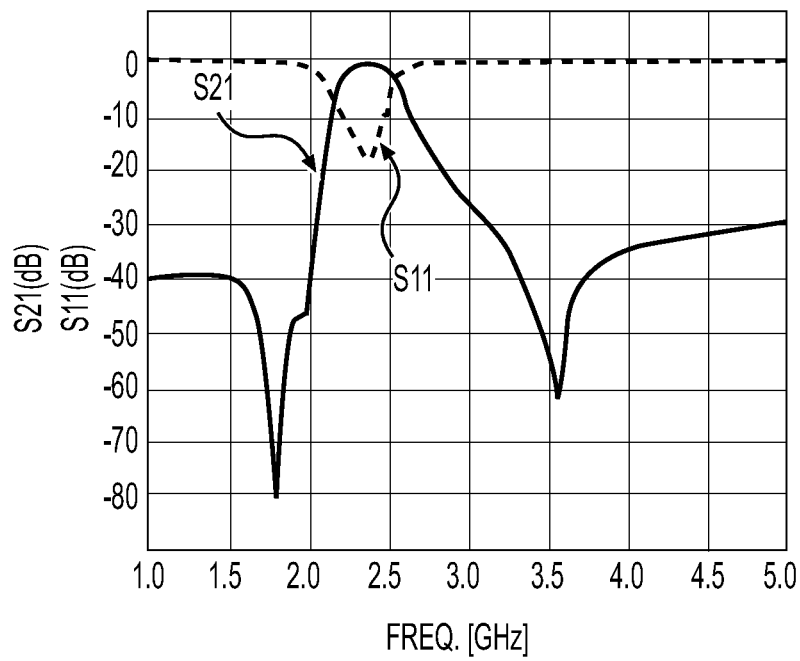

In the band pass filter 100, attenuation exceeding about −53 dB is secured in the low frequency side relative to the low frequency side attenuation pole. Further, the attenuation exceeding about −38 dB is secured in the high frequency side relative to the high frequency side attenuation pole. In particular, in S21 in the high frequency side relative to the high frequency side attenuation pole, a tendency that the absolute value gradually decreases accompanying an increase in the frequency (see FIG. 19B) is not observed.

In the band pass filter 100, therefore, as the result that the electromagnetic field coupling is effectively generated by the above-described structure, sufficient attenuation characteristics are able to be provided even in a frequency range of the high frequency side or the low frequency side relative to the pass band.

Each capacitance value defining the band pass filter 100 may be set based on an area of the conductor pattern defining the capacitors and a relative permittivity of a dielectric material. Furthermore, each inductance value may be set by the number of connections of the via conductors defining each inductor. That is, each inductance value is able to be changed by adjusting the number of dielectric layers, in which only the via conductors are provided, for example, dielectric layers DL3 and DL4 and the dielectric layers DL7 to DL9, in the band pass filter 100. Also, in each of the preferred embodiments which are described herein, each capacitance value and each inductance value are adjusted.

Second Embodiment of Band Pass Filter

A band pass filter 100A which is a second preferred embodiment of the band pass filter according to the present invention will be described with reference to FIG. 4 and FIG. 5.

Figure 4:
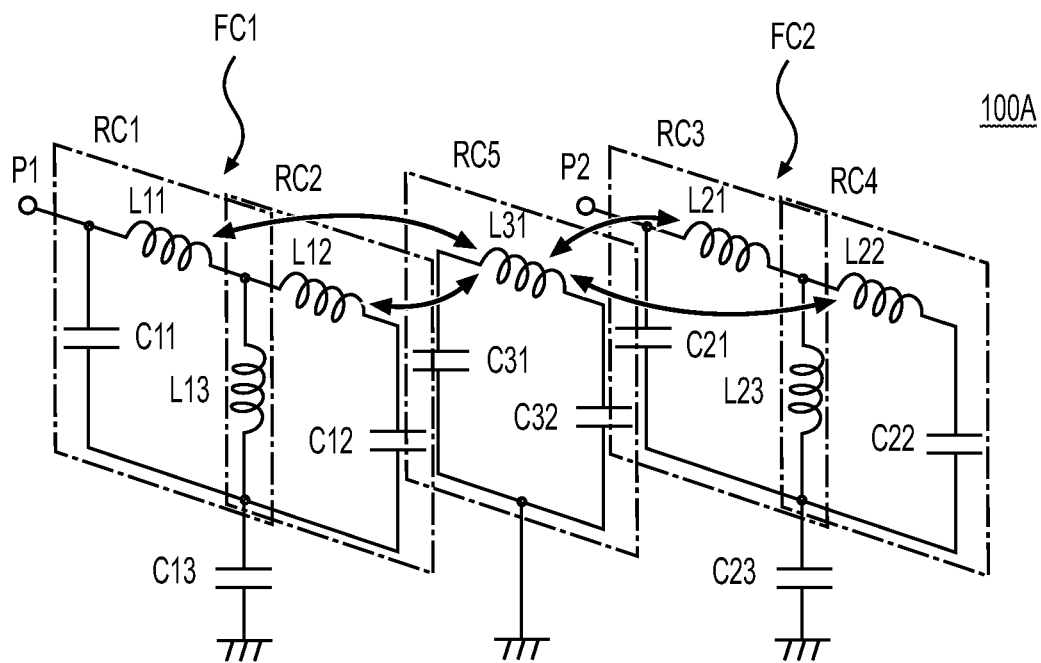
FIG. 4 is an equivalent circuit diagram of a band pass filter 100A which is a second preferred embodiment of the band pass filter according to the present invention.

FIG. 4 is an equivalent circuit diagram of the band pass filter 100A. Similarly to the band pass filter 100, the band pass filter 100A includes the first filter circuit FC1, the second filter circuit FC2, and the fifth resonant circuit RC5.

In the band pass filter 100A, the first filter circuit FC1 further includes a ninth capacitor C13. The ninth capacitor C13 is electrically connected between the connection point of the first capacitor C11, the second capacitor C12, and the seventh inductor L13 and the ground. In addition, the second filter circuit FC2 further includes a tenth capacitor C23. The tenth capacitor C23 is electrically connected between the connection point of the third capacitor C21, the fourth capacitor C22, and the eighth inductor L23 and the ground.

The other elements are the same as or similar to those of the band pass filter 100. Therefore, a further description thereof will be omitted here.

Figure 5:
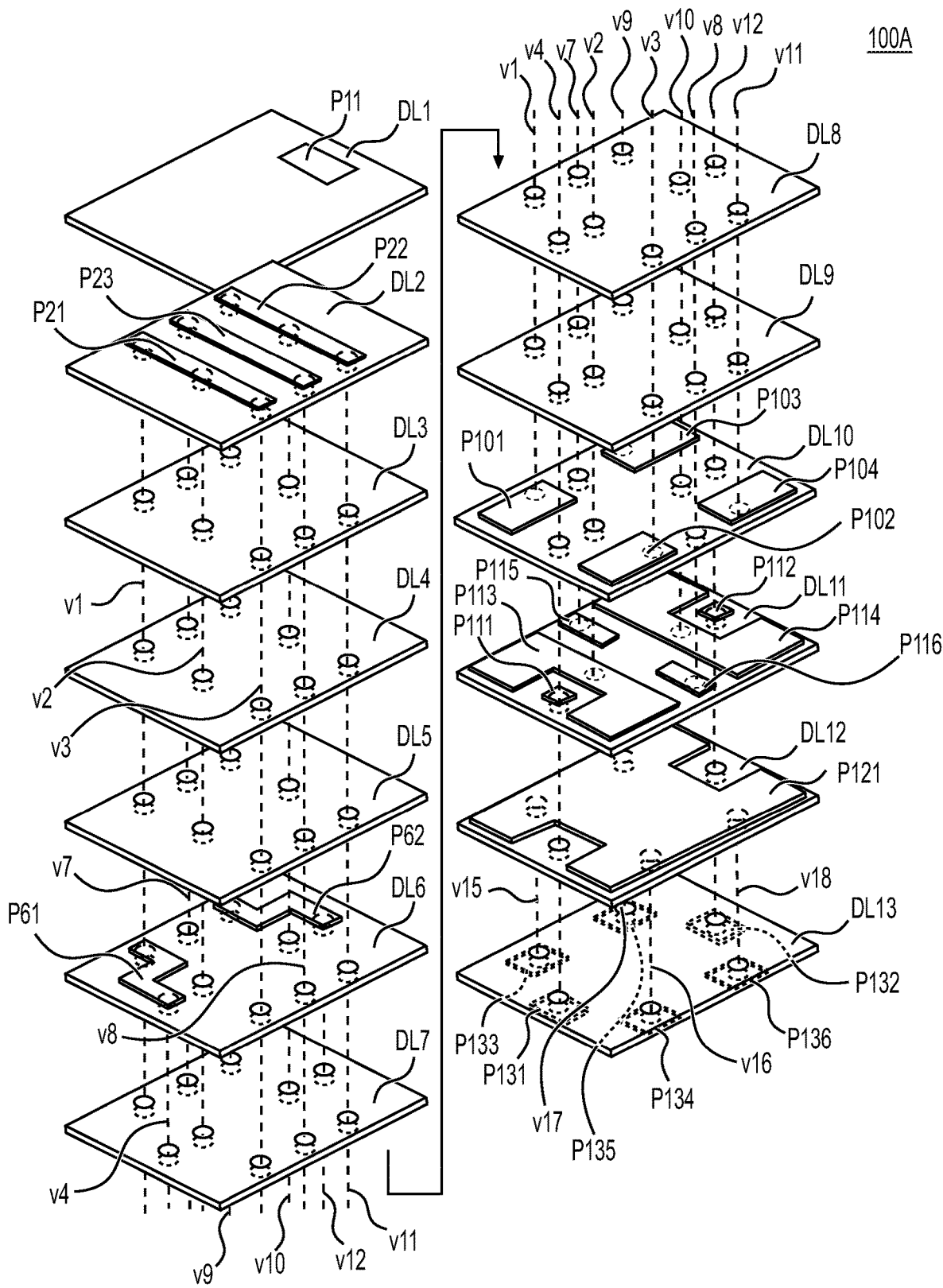
FIG. 5 is an exploded perspective view of the band pass filter 100A.

FIG. 5 is an exploded perspective view of the band pass filter 100A. Similarly to the band pass filter 100, the band pass filter 100A includes a multilayer body formed by laminating the dielectric layers DL1 to DL13, a plurality of pattern conductors, and a plurality of via conductors. The first filter circuit FC1, the second filter circuit FC2, and the fifth resonant circuit RC5 are defined by the dielectric layers, the pattern conductors, and the via conductors.

As described above, in the band pass filter 100A, the first filter circuit FC1 further includes the ninth capacitor C13. The ninth capacitor C13 is defined by the pattern conductors P113 and P121. That is, in the band pass filter 100A, the pattern conductor P113 and the pattern conductor P121 are not electrically connected by the via conductor. As described above, the pattern conductor P121 is a ground electrode. Then, the first capacitor C11, the second capacitor C12, and the ninth capacitor C13 share the pattern conductor P113.

In addition, in the band pass filter 100A, the second filter circuit FC2 further includes the tenth capacitor C23. The tenth capacitor C23 is defined by the pattern conductors P114 and P121. That is, in the band pass filter 100A, the pattern conductor P114 and the pattern conductor P121 are not electrically connected by the via conductor. As described above, the pattern conductor P121 is the ground electrode. Then, the third capacitor C21, the fourth capacitor C22, and the tenth capacitor C23 share the pattern conductor P114.

The other elements are the same as or similar to those of the band pass filter 100. Therefore, a further description thereof will be omitted here.

In the band pass filter 100A, isolation between the first filter circuit FC1 and the second filter circuit FC2 is able to be provided because of the above-described structure. As a result, in addition to the above-described effects, an attenuation characteristic in a high frequency side relative to a pass band is able to be further significantly improved.

Third Embodiment of Band Pass Filter

A band pass filter 100B which is a third preferred embodiment of the band pass filter according to the present invention will be described with reference to FIG. 6 to FIG. 8.

Figure 6:
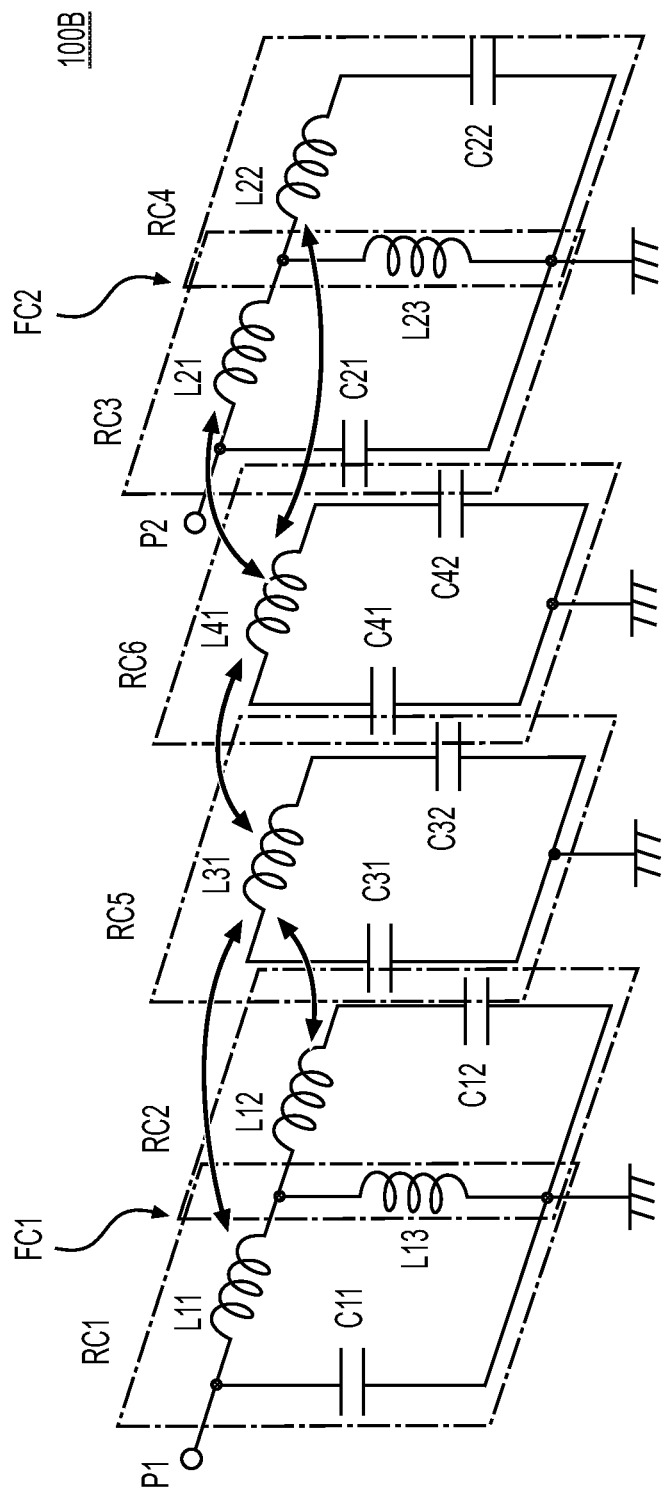
FIG. 6 is an equivalent circuit diagram of a band pass filter 100B which is a third preferred embodiment of the band pass filter according to the present invention.

FIG. 6 is an equivalent circuit diagram of the band pass filter 100B. The band pass filter 100B includes the first filter circuit FC1, the second filter circuit FC2, the fifth resonant circuit RC5, and a sixth resonant circuit RC6. The first filter circuit FC1, the second filter circuit FC2, and the fifth resonant circuit RC5 in the band pass filter 100B are the same as or similar to those of the band pass filter 100. Therefore, a further description thereof will be omitted here.

The sixth resonant circuit RC6 includes a seventh capacitor C41, an eighth capacitor C42, and a sixth inductor L41. The seventh capacitor C41 and the eighth capacitor C42 are electrically connected to the ground, respectively. The sixth inductor L41 is electrically connected between the seventh capacitor C41 and the eighth capacitor C42.

A fifth inductor L31 is electromagnetically coupled to each of the first inductor L11 and the second inductor L12. In addition, the sixth inductor L41 is electromagnetically coupled to each of the third inductor L21 and the fourth inductor L22. Further, the fifth inductor L31 and the sixth inductor L41 are electromagnetically coupled to each other.

Another resonant circuit, which includes another capacitor and another inductor, may further be provided between the fifth resonant circuit RC5 and the sixth resonant circuit RC6. Accordingly, the fifth inductor L31 is electromagnetically coupled to the inductor, and the inductor is electromagnetically coupled to the sixth inductor L41. As a result, the fifth inductor L31 and the sixth inductor L41 are electromagnetically coupled to each other, indirectly. The number of other resonant circuits provided between the fifth resonant circuit RC5 and the sixth resonant circuit RC6 is not particularly limited.

Figure 7:
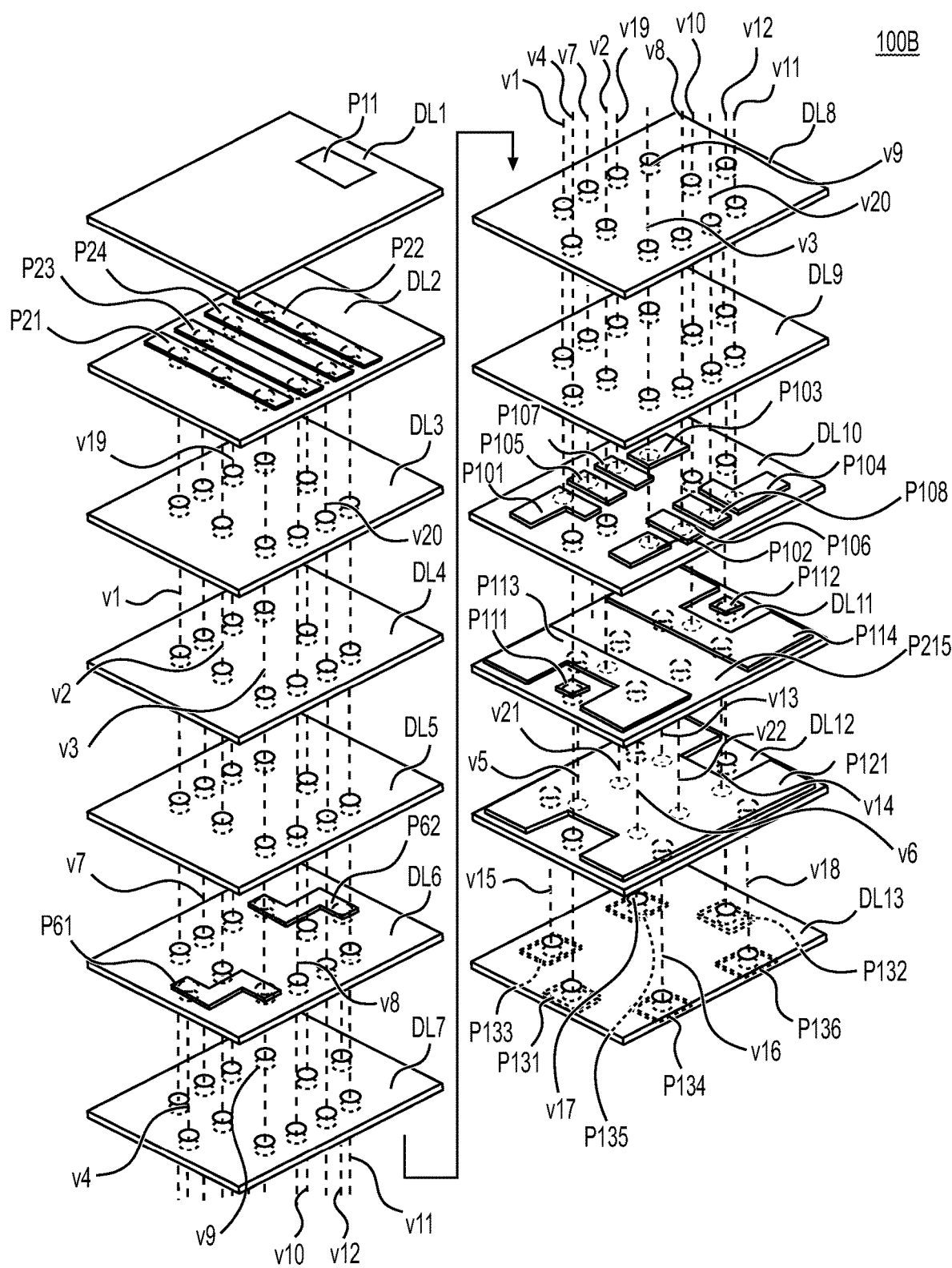
FIG. 7 is an exploded perspective view of the band pass filter 100B.

FIG. 7 is an exploded perspective view of the band pass filter 100B. Similarly to the band pass filters 100 and 100A, the band pass filter 100B includes a multilayer body formed by laminating the dielectric layers DL1 to DL13, a plurality of pattern conductors, and a plurality of via conductors. The first filter circuit FC1, the second filter circuit FC2, the fifth resonant circuit RC5, and the sixth resonant circuit RC6 are defined by the dielectric layers, the pattern conductors, and the via conductors. Although the direction mark P11 is provided on the dielectric layer DL1 also in FIG. 7, this is not necessary.

In the first filter circuit FC1 of the band pass filter 100B, the structure and layout of the pattern conductor P61 provided on the dielectric layer DL6 is different from that of the band pass filter 100. Further, the shapes of the pattern conductors P101 and P102 provided on the dielectric layer DL10 are different from those of the band pass filter 100. However, the structure, layout, and shapes of the pattern conductors P61, P101, and P102 are not required differences, and elements except for the pattern conductors P61, P101, and P102 are the same as or similar to those of the first filter circuit FC1 of the band pass filter 100. Therefore, a further description of the first filter circuit FC1 will be omitted here.

In addition, in the second filter circuit FC2 in the band pass filter 100B, the shapes of pattern conductors P103 and P104 provided on the dielectric layer DL10 are different from those of the band pass filter 100. However, the shapes of pattern conductors P103 and P104 are not required differences, and elements except for the shapes of pattern conductors P103 and P104 are the same as or similar to those of the second filter circuit FC2 of the band pass filter 100. Therefore, a further description of the second filter circuit FC2 will be omitted here.

The fifth resonant circuit RC5 is defined by a third ground side capacitor electrode, the fifth capacitor C31, the sixth capacitor C32, and the fifth inductor L31 electrically connected between the fifth capacitor C31 and the sixth capacitor C32. The third ground side capacitor electrode is a pattern conductor P215 provided on the dielectric layer DL11.

The pattern conductor P113, which is a first ground side capacitor electrode, is electrically connected to the pattern conductor P121 through the via conductors v5 and v6 provided in the dielectric layers DL11 to DL12. The pattern conductor P114, which is a second ground side capacitor electrode, is electrically connected to the pattern conductor P121 through the via conductors v13 and v14 provided in the dielectric layers DL11 to DL12. The pattern conductor P215 is electrically connected to the pattern conductor P121 through via conductors v21 and v22 provided in the dielectric layers DL11 to DL12. That is, the pattern conductor P121 defines and functions as a common ground electrode. The pattern conductor P121 is electrically connected to each of the third terminal electrode P133, the fourth terminal electrode P134, the fifth terminal electrode P135, and the sixth terminal electrode P136, as described above.

The fifth capacitor C31 is defined by a pattern conductor P105 and the pattern conductor P215. The sixth capacitor C32 is defined by a pattern conductor P106 and the pattern conductor P215. That is, the fifth capacitor C31 and the sixth capacitor C32 share the pattern conductor P215 which is the third ground side capacitor electrode. The fifth inductor L31 is defined by the pattern conductor P23, and the via conductors v7 and v8 formed in the dielectric layers DL2 to DL10. The via conductors v7 and v8 are electrically connected to both end portions of the pattern conductor P23.

The sixth resonant circuit RC6 includes the third ground side capacitor electrode, the seventh capacitor C41, the eighth capacitor C42, and the sixth inductor L41 electrically connected between the seventh capacitor C41 and the eighth capacitor C42. As described above, the third ground side capacitor electrode is the pattern conductor P215 provided on the dielectric layer DL11. The connection between the pattern conductor P215 and the other elements is as described above.

The seventh capacitor C41 is defined by a pattern conductor P107 and the pattern conductor P215. The eighth capacitor C42 is defined by a pattern conductor P108 and the pattern conductor P215. That is, the seventh capacitor C41 and the eighth capacitor C42 share the pattern conductor P215 which is the third ground side capacitor electrode. The sixth inductor L41 is defined by a pattern conductor P24 and via conductors v19 and v20 provided in the dielectric layers DL2 to DL10. The via conductors v19 and v20 are electrically connected to both end portions of the pattern conductor P24.

The fifth resonant circuit RC5 and the sixth resonant circuit RC6 are in parallel between the first filter circuit FC1 and the second filter circuit FC2 as follows. That is, a first plane similar to that of the above-described band pass filter 100 is defined. When the first inductor L11 and the second inductor L12 are projected onto the first plane, the first inductor L11 and the second inductor L12 overlap with the fifth inductor L31.

Further, a virtual plane, on which the sixth inductor L41 is provided, is referred to as a second plane. That is, the second plane refers to a plane including a central section along the central axes of respective via conductors and a longitudinal direction of the pattern conductor P24, considering manufacturing errors.

When the third inductor L21 and the fourth inductor L22 are projected onto the second plane, the third inductor L21 and the fourth inductor L22 overlap with the sixth inductor L41. Further, when the sixth inductor L41 is projected onto the first plane, the sixth inductor L41 overlaps with the fifth inductor L31.

Accordingly, each of the first inductor L11 and the second inductor L12 is electromagnetically coupled to the fifth inductor L31 as indicated by arrows in FIG. 6. In addition, each of the third inductor L21 and the fourth inductor L22 is electromagnetically coupled to the sixth inductor L41, similarly. Further, the fifth inductor L31 and the sixth inductor L41 are electromagnetically coupled to each other, similarly.

In the band pass filter 100B shown in FIG. 7, the entire first inductor L11 and the entire second inductor L12 overlap with the fifth inductor L31, respectively. The entire third inductor L21 and the entire fourth inductor L22 overlap with the sixth inductor L41, respectively. Further, the entire fifth inductor L31 overlaps with the entire sixth inductor L41.

However, it is sufficient that at least a portion of each of the first inductor L11 and the second inductor L12 overlaps with the fifth inductor L31. In addition, it is sufficient that at least a portion of each of the third inductor L21 and the fourth inductor L22 overlaps with the sixth inductor L41.

Further, it is sufficient that at least a portion of the sixth inductor L41 overlaps with the fifth inductor L31.

For example, the pattern conductor P23 may be longer than or shorter than the pattern conductor P21. Further, the pattern conductor P24 may be longer than or shorter than the pattern conductor P22.

Figure 8:
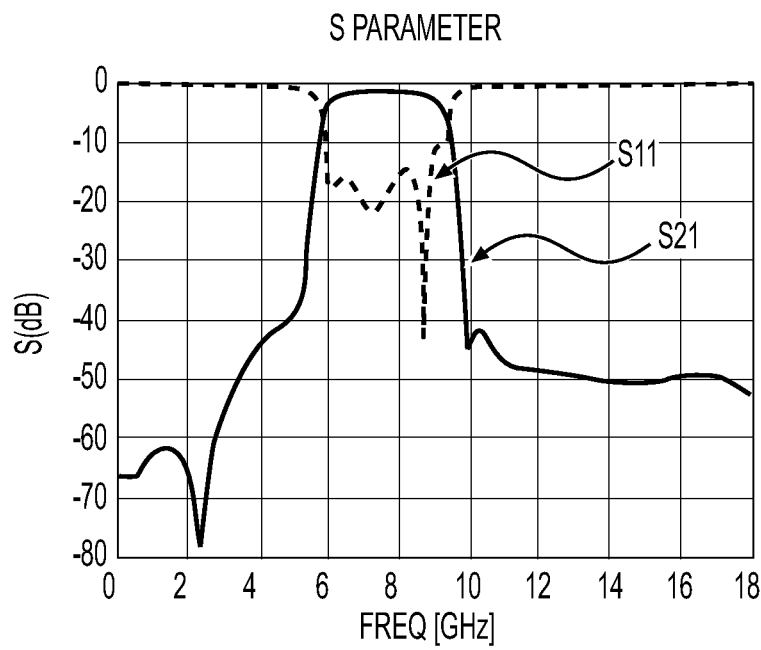
FIG. 8 is a filter characteristic chart of the band pass filter 100B.

In FIG. 8, described is the filter characteristic of the band pass filter 100B when capacitance of each capacitor and inductance of each inductor are set to a predetermined value. Focusing on S21 of the filter characteristic, there are attenuation poles of about −78 dB in a low frequency side and about −45 dB in a high frequency side relative to a pass band.

In the band pass filter 100B, the attenuation exceeding about −62 dB is secured in the low frequency side relative to the low frequency side attenuation pole. Further, attenuation exceeding about −42 dB is secured in the high frequency side relative to a high frequency side attenuation pole. In particular, in S21 in the high frequency side relative to the high frequency side attenuation pole, a tendency that the absolute value gradually decreases accompanying an increase in the frequency (see FIG. 19B) is not observed.

In addition, in the band pass filter 100B, a width of the pass band is approximately 1.5 times larger than that of the band pass filter 100. Further, a degree of decrease in the absolute value of the attenuation in the low frequency side relative to the low frequency side attenuation pole becomes smaller. Further, the attenuation from the pass band to the high frequency side attenuation pole becomes still steeper (see FIG. 3).

This is considered that the balance of the electromagnetic field coupling is significantly improved due to increasing the number of resonant circuits to two, which are in parallel between the first filter circuit FC1 and the second filter circuit FC2.

Therefore, in the band pass filter 100B, as the result that the electromagnetic field coupling is more effectively generated by the above-described structure, the attenuation characteristic in the high frequency side and in the low frequency side relative to the pass band is able to be further significantly improved.

Fourth Embodiment of Band Pass Filter

A band pass filter 100C which is a fourth preferred embodiment of the band pass filter according to the present invention will be described with reference to FIG. 9 and FIG. 10.

Figure 9:
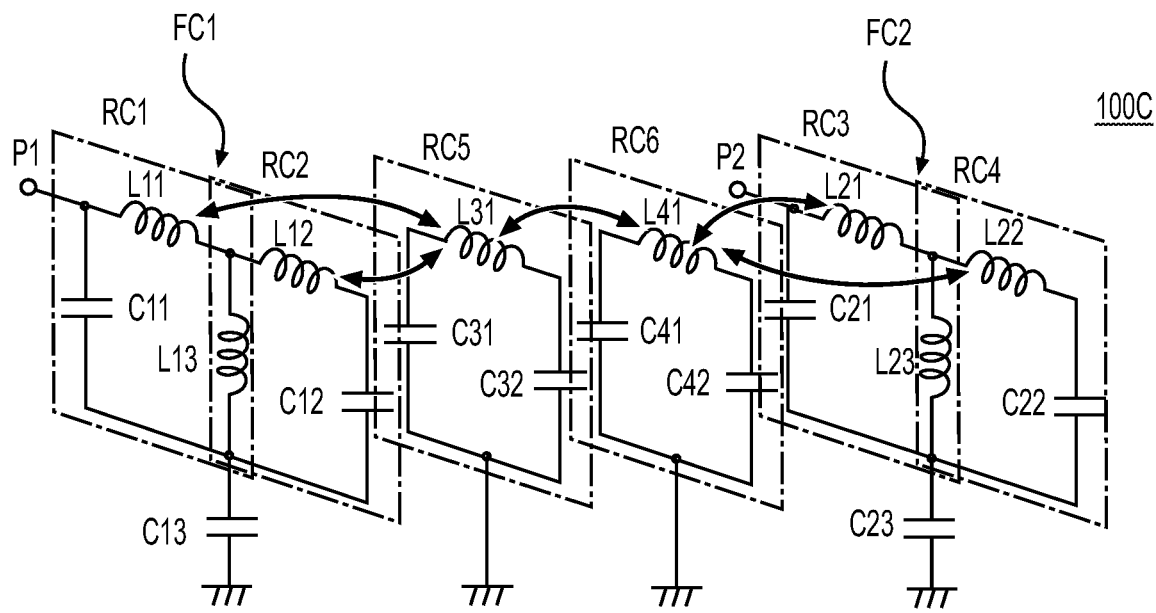
FIG. 9 is an equivalent circuit diagram of a band pass filter 100C which is a fourth preferred embodiment of the band pass filter according to the present invention.

FIG. 9 is an equivalent circuit diagram of the band pass filter 100C. Similarly to the band pass filter 100B, the band pass filter 100C includes the first filter circuit FC1, the second filter circuit FC2, the fifth resonant circuit RC5, and the sixth resonant circuit RC6.

In the band pass filter 100C, the first filter circuit FC1 further includes the ninth capacitor C13. The ninth capacitor C13 is the same as or similar to that included in the first filter circuit FC1 of the band pass filter 100A. In addition, the second filter circuit FC2 further includes the tenth capacitor C23. The tenth capacitor C23 is the same as or similar to that included in the second filter circuit FC2 of the band pass filter 100A.

The other elements are the same as or similar to those of the band pass filter 100B. Therefore, a further description thereof will be omitted here.

Figure 10:
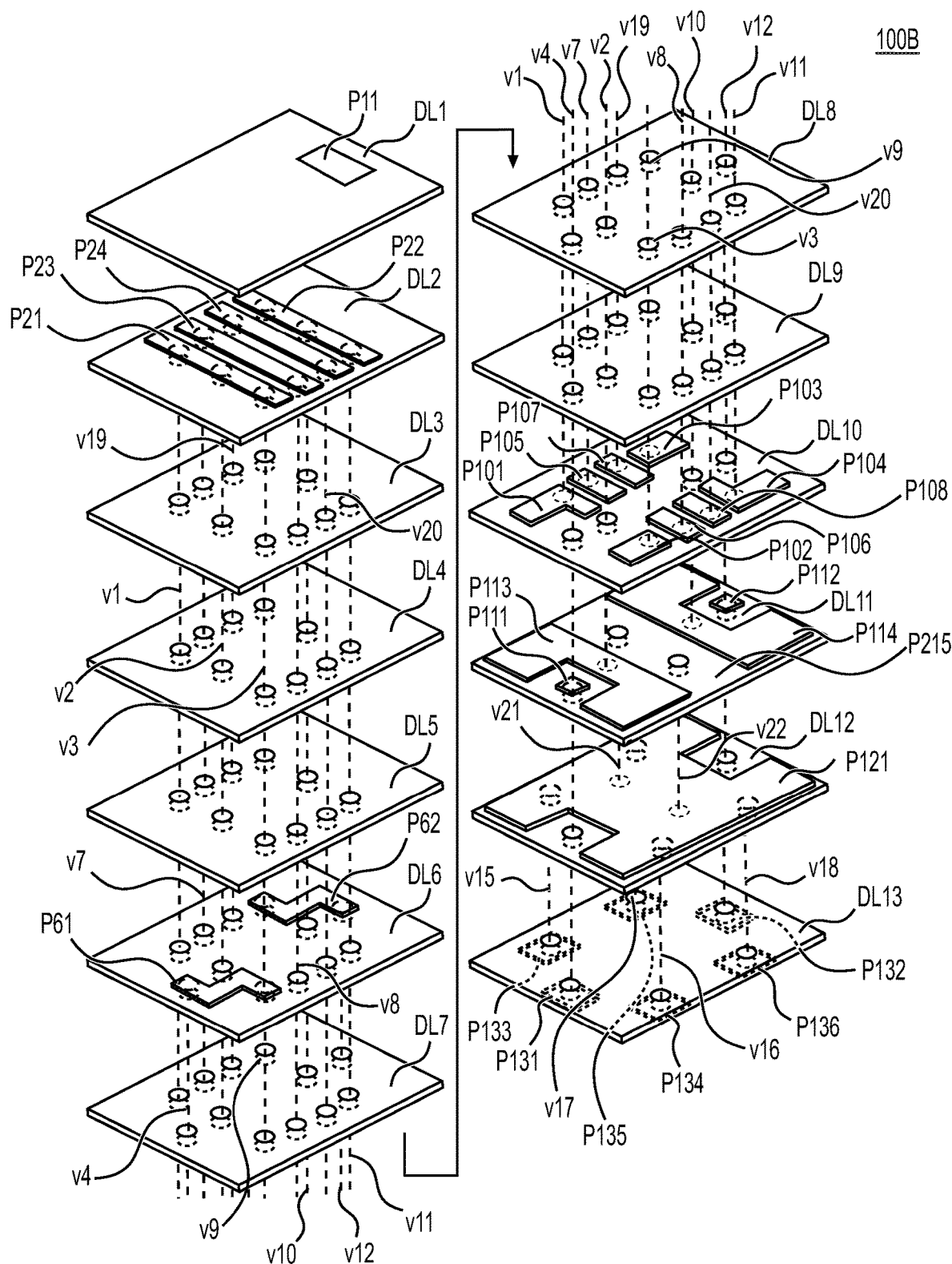
FIG. 10 is an exploded perspective view of the band pass filter 100C.

FIG. 10 is an exploded perspective view of the band pass filter 100C. Similarly to the band pass filter 100B, the band pass filter 100C includes a multilayer body formed by laminating the dielectric layers DL1 to DL13, a plurality of pattern conductors, and a plurality of via conductors. The first filter circuit FC1, the second filter circuit FC2, the fifth resonant circuit RC5, and the sixth resonant circuit RC6 are defined by the dielectric layers, the pattern conductors, and the via conductors.

As described above, in the band pass filter 100C, the first filter circuit FC1 further includes the ninth capacitor C13. In addition, the second filter circuit FC2 further includes the tenth capacitor C23. The ninth capacitor C13 and the tenth capacitor C23 are similar to those in the band pass filter 100A.

The other elements are the same as or similar to those of the band pass filter 100B. Therefore, a further description thereof will be omitted here.

In the band pass filter 100C, isolation between the first filter circuit FC1 and the second filter circuit FC2 is able to be provided because of the above-described structure. As a result, in addition to the above-described effects, an attenuation characteristic in a high frequency side relative to a pass band is able to be further significantly improved.

Fifth Embodiment of Band Pass Filter

A band pass filter 100D which is a fifth preferred embodiment of the band pass filter according to the present invention will be described with reference to FIG. 11 to FIG. 13.

Figure 11:
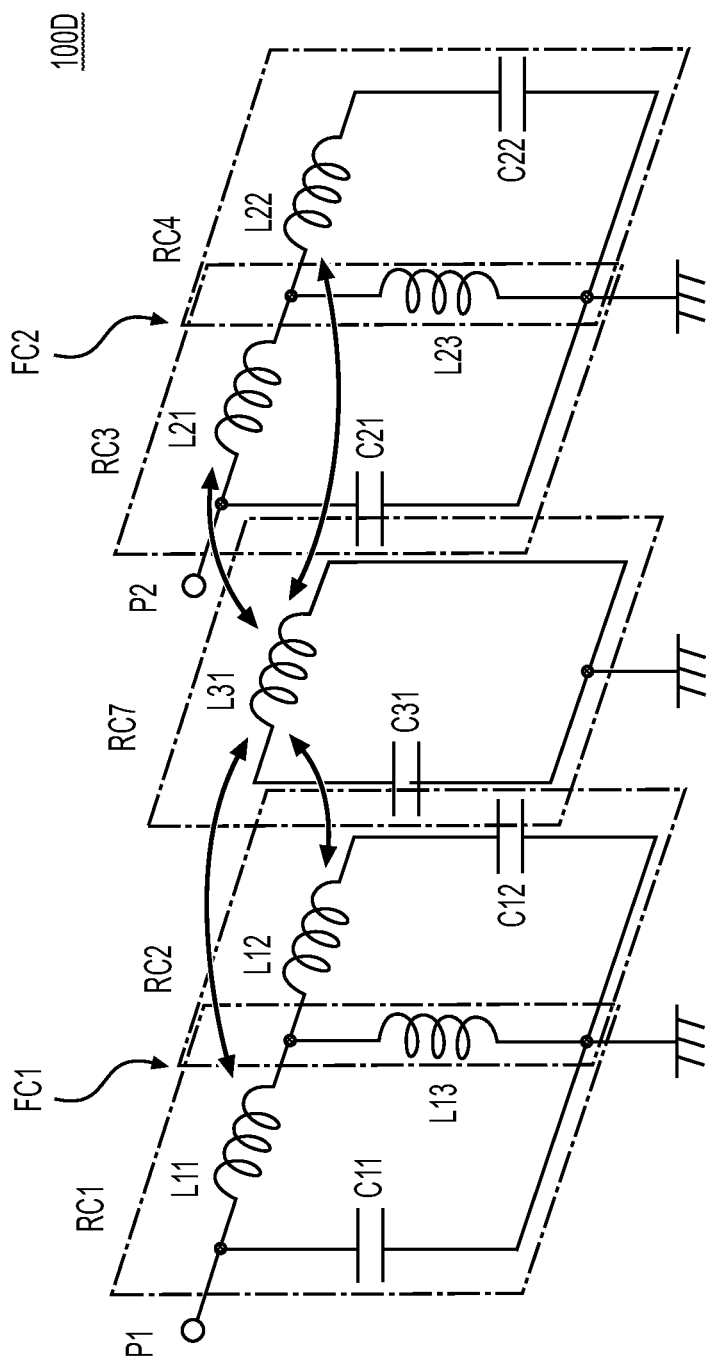
FIG. 11 is an equivalent circuit diagram of a band pass filter 100D which is a fifth preferred embodiment of the band pass filter according to the present invention.

FIG. 11 is an equivalent circuit diagram of the band pass filter 100D. The band pass filter 100D includes the first filter circuit FC1, the second filter circuit FC2, and a seventh resonant circuit RC7. The first filter circuit FC1 and the second filter circuit FC2 in the band pass filter 100D are the same as or similar to those of the band pass filter 100. Therefore, a further description thereof will be omitted here.

The seventh resonant circuit RC7 includes the fifth capacitor C31 and the fifth inductor L31. The fifth capacitor C31 is electrically connected to the ground. The fifth inductor L31 is electrically connected between the ground and the fifth capacitor C31.

Then, the fifth inductor is electromagnetically coupled to each of the first inductor, the second inductor, the third inductor, and the fourth inductor.

Figure 12:
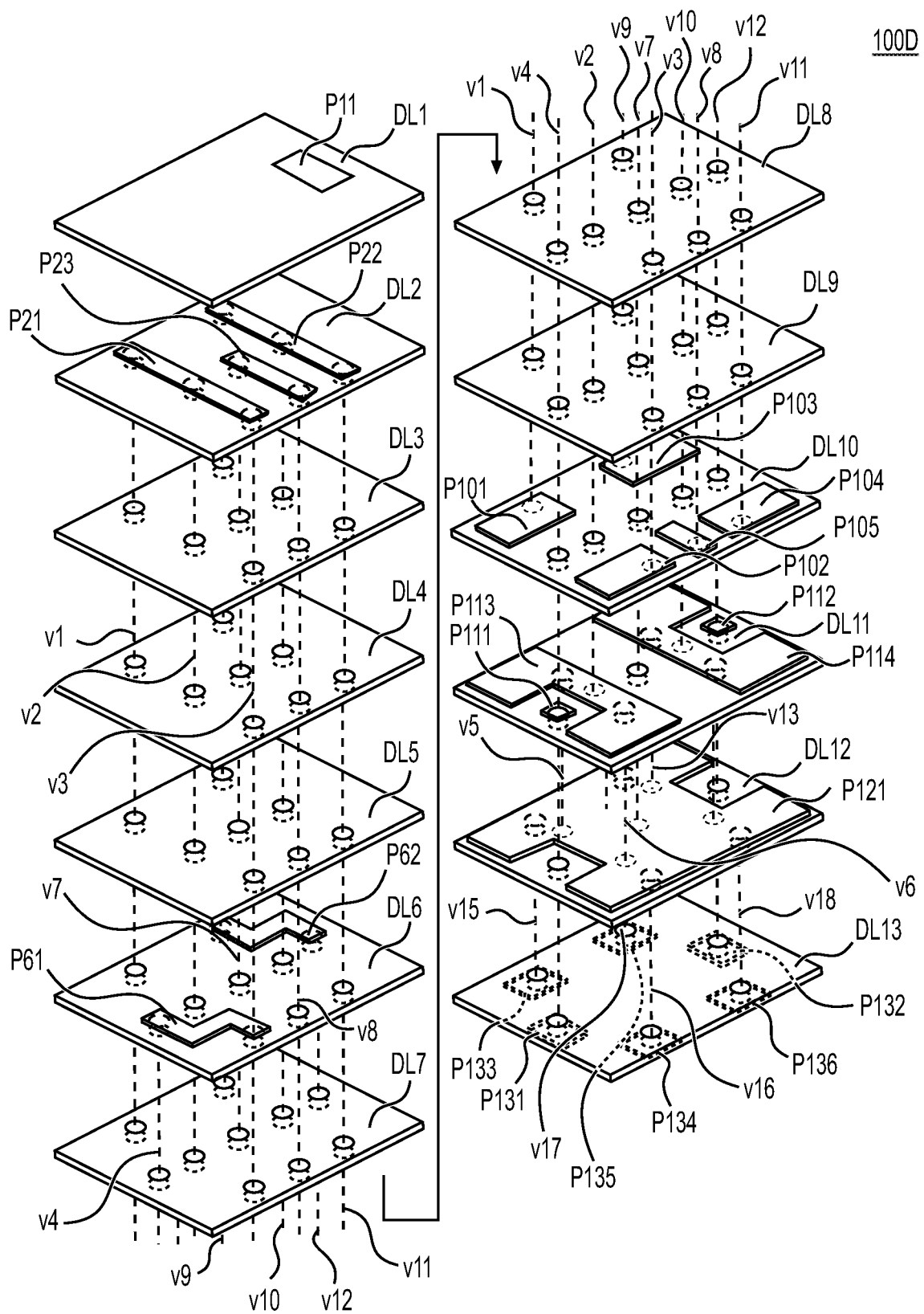
FIG. 12 is an exploded perspective view of the band pass filter 100D.

FIG. 12 is an exploded perspective view of the band pass filter 100D. Similarly to the band pass filter 100, the band pass filter 100D includes a multilayer body formed by laminating the dielectric layers DL1 to DL13, a plurality of pattern conductors, and a plurality of via conductors. The first filter circuit FC1, the second filter circuit FC2, and the seventh resonant circuit RC7 are defined by the dielectric layers, the pattern conductors, and the via conductors. Although the direction mark P11 is provided on the dielectric layer DL1 also in FIG. 12, this is not necessary.

In the first filter circuit FC1 in the band pass filter 100D, the structure and layout of the pattern conductor P61 provided on the dielectric layer DL6 is different from that of the band pass filter 100. However, it is not a required difference, and elements except for the structure and layout of the pattern conductor P61 are the same as or similar to those of the first filter circuit FC1 of the band pass filter 100. Therefore, a further description of the first filter circuit FC1 will be omitted here.

The seventh resonant circuit RC7 includes a ground electrode, the fifth capacitor C31, and the fifth inductor L31 electrically connected between the ground electrode and the fifth capacitor C31.

In the seventh resonant circuit RC7, one of the pattern conductors defining the fifth capacitor C31 is not provided on the dielectric layer DL11, and is provided as the pattern conductor P105 on the dielectric layer DL10. However, it is not a required difference, similar to the band pass filter 100, and one of the pattern conductors defining the fifth capacitor C31 may be formed on the dielectric layer DL11.

Further, the via conductor v7 that is provided on the dielectric layers DL2 to DL10 and that is electrically connected to one end of the pattern conductor P23 defining the fifth inductor L31 is located in the central portion of each dielectric layer. That is, the pattern conductor P23 in the band pass filter 100D is formed to be shorter than the pattern conductor P23 in the band pass filter 100.

The other elements are the same as or similar to those of the band pass filter 100. Therefore, a further description thereof will be omitted here.

The seventh resonant circuit RC7 is provided between the first filter circuit FC1 and the second filter circuit FC2 as follows. That is, the fifth inductor L31 is electromagnetically coupled to each of the first inductor L11, the second inductor L12, the third inductor L21, and the fourth inductor L22 (see arrows in FIG. 11).

Figure 13:
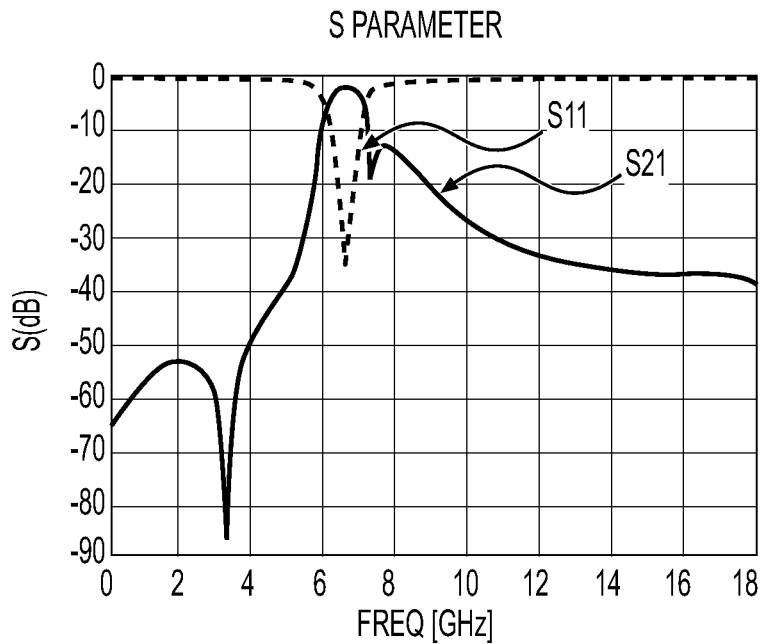
FIG. 13 is a filter characteristic chart of the band pass filter 100D.

In FIG. 13, described is a filter characteristic of the band pass filter 100 when capacitance of each capacitor and inductance of each inductor are set to a predetermined value. Focusing on S21 of the filter characteristic, there are attenuation poles of about −87 dB in a low frequency side and about −20 dB in a high frequency side relative to a pass band.

In the band pass filter 100D, attenuation exceeding about −53 dB is secured in the low frequency side relative to a low frequency side attenuation pole. Further, the attenuation exceeding about −14 dB is secured in the high frequency side relative to the high frequency side attenuation pole. In particular, in S21 in the high frequency side relative to the high frequency side attenuation pole, a tendency that the absolute value gradually decreases accompanying an increase in the frequency (see FIG. 19B) is not observed.

Therefore, in the band pass filter 100D, as the result that the electromagnetic field coupling is effectively generated by the above-described structure, a decrease in the absolute value of S21 in a frequency range of the high frequency side and the low frequency side relative to the pass band is able to be significantly reduced or prevented.

Sixth Embodiment of Band Pass Filter

A band pass filter 100E which is a sixth preferred embodiment of the band pass filter according to the present invention will be described with reference to FIG. 14.

Figure 14:
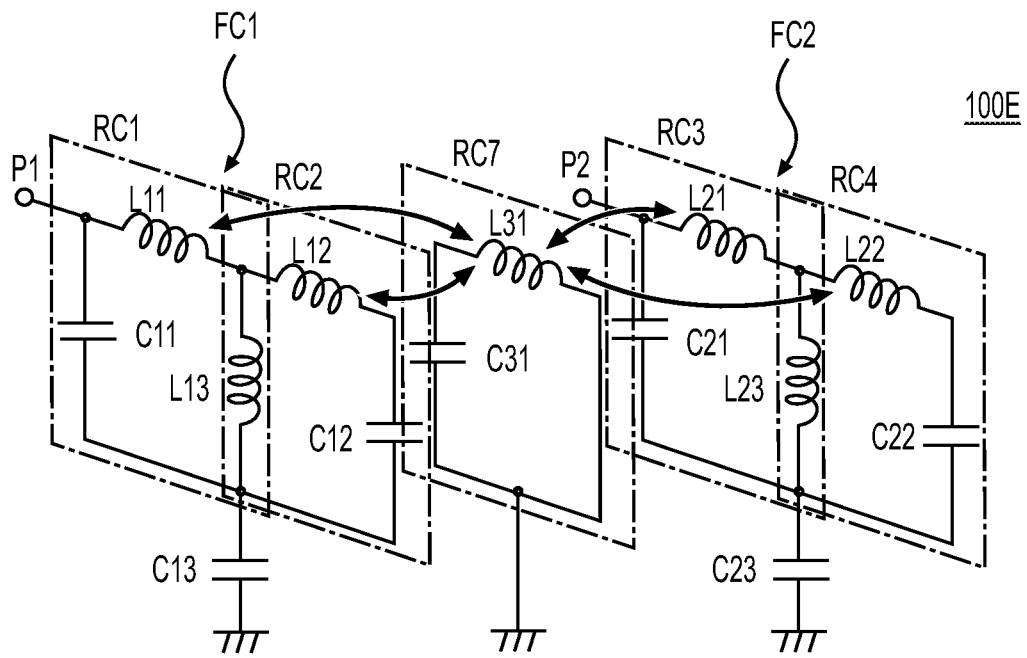
FIG. 14 is an equivalent circuit diagram of a band pass filter 100E which is a sixth preferred embodiment of the band pass filter according to the present invention.

FIG. 14 is an equivalent circuit diagram of the band pass filter 100E. Similarly to the band pass filter 100D, the band pass filter 100E includes the first filter circuit FC1, the second filter circuit FC2, and the seventh resonant circuit RC7.

In the band pass filter 100E, similarly to the band pass filter 100A, the first filter circuit FC1 further includes a ninth capacitor C13. In addition, the second filter circuit FC2 further includes the tenth capacitor C23.

The other elements are the same as or similar to those of the band pass filter 100D. Therefore, a further description thereof will be omitted here.

In the band pass filter 100E, isolation between the first filter circuit FC1 and the second filter circuit FC2 is able to be provided because of the above-described structure. As a result, in addition to the above-described effects, the absolute value of attenuation in a high frequency side relative to a pass band is able to be significantly increased.

Seventh Embodiment of Band Pass Filter

A bandpass filter 100F which is a seventh preferred embodiment of the band pass filter according to the present invention will be described with reference to FIG. 15.

Figures 15, 16:
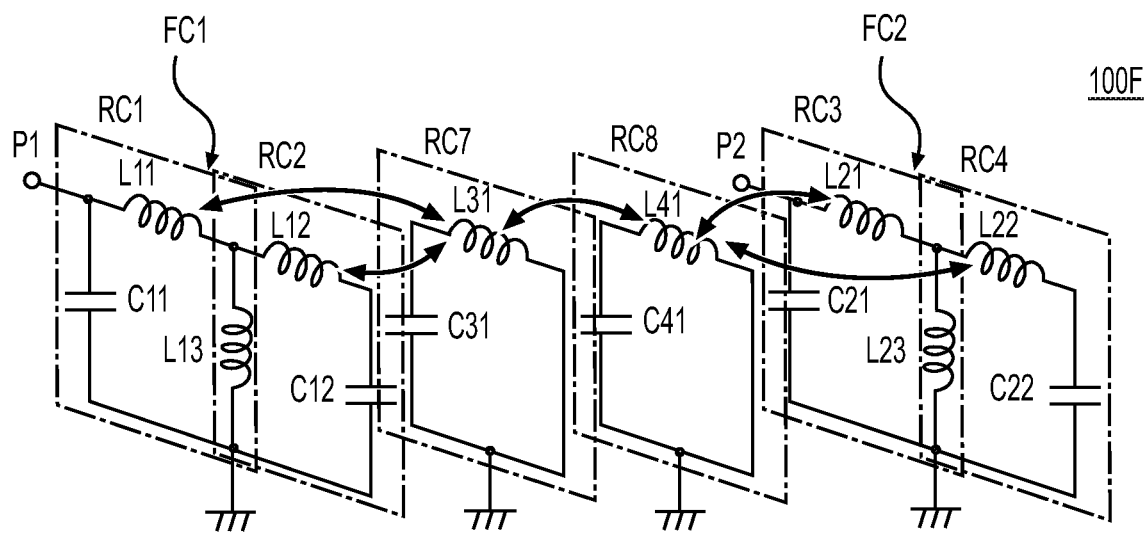
FIG. 15 is an equivalent circuit diagram of a band pass filter 100F which is a seventh preferred embodiment of the band pass filter according to the present invention.
FIG. 16 is an equivalent circuit diagram of a band pass filter 100G which is an eighth preferred embodiment of the band pass filter according to the present invention.

FIG. 15 is an equivalent circuit diagram of the band pass filter 100F. The band pass filter 100F includes the first filter circuit FC1, the second filter circuit FC2, the seventh resonant circuit RC7, and an eighth resonant circuit RC8. The first filter circuit FC1, the second filter circuit FC2, and the seventh resonant circuit RC7 in the band pass filter 100F are the same as or similar to those of the band pass filter 100D. Therefore, a further description thereof will be omitted here.

The eighth resonant circuit RC8 has the seventh capacitor C41 and the sixth inductor L41. The seventh capacitor C41 is electrically connected to the ground. The sixth inductor L41 is electrically connected between the ground and the seventh capacitor C41.

The fifth inductor L31 is electromagnetically coupled to each of the first inductor L11 and the second inductor L12. In addition, the sixth inductor L41 is electromagnetically coupled to each of the third inductor L21 and the fourth inductor L22. Further, the fifth inductor L31 and the sixth inductor L41 are electromagnetically coupled to each other.

Another resonant circuit, which includes another capacitor and another inductor, may be provided between the seventh resonant circuit RC7 and the eighth resonant circuit RC8. Accordingly, the fifth inductor L31 is electromagnetically coupled to the inductor, and the inductor is electromagnetically coupled to the sixth inductor L41. As a result, the fifth inductor L31 and the sixth inductor L41 are electromagnetically coupled to each other, indirectly. The number of other resonant circuits provided between the seventh resonant circuit RC7 and the eighth resonant circuit RC8 is not particularly limited.

In the band pass filter 100F, it is considered that a balance of the electromagnetic field coupling is significantly improved since the number of resonant circuits provided between the first filter circuit FC1 and the second filter circuit FC2 is increased to two.

Therefore, in the band pass filter 100F, as the result that the electromagnetic field coupling is more effectively generated by the above-described structure, an attenuation characteristic in a high frequency side and in a low frequency side relative to a pass band is able to be further significantly improved.

Eighth Embodiment of Band Pass Filter

A bandpass filter 100G which is an eighth preferred embodiment of the band pass filter according to the present invention will be described with reference to FIG. 16.

FIG. 16 is an equivalent circuit diagram of the band pass filter 100G. Similarly to the band pass filter 100F, the band pass filter 100G includes the first filter circuit FC1, the second filter circuit FC2, the seventh resonant circuit RC7, and the eighth resonant circuit RC8.

In the band pass filter 100G, similarly to the band pass filter 100E, the first filter circuit FC1 further includes the ninth capacitor C13. In addition, the second filter circuit FC2 further includes the tenth capacitor C23.

The other elements are the same as or similar to those of the band pass filter 100F. Therefore, a further description thereof will be omitted here.

With respect to the band pass filter 100G, isolation between the first filter circuit FC1 and the second filter circuit FC2 is able to be provided because of the above-described structure. As a result, in addition to the above-described effects, an attenuation characteristic in a high frequency side relative to a pass band is able to be further significantly improved.

Reference Examples of Band Pass Filter

The band pass filters 100H to 100K, which are reference examples of band pass filters, will be described with reference to FIGS. 17A and 17B and FIG. 18.

Figure 17A:
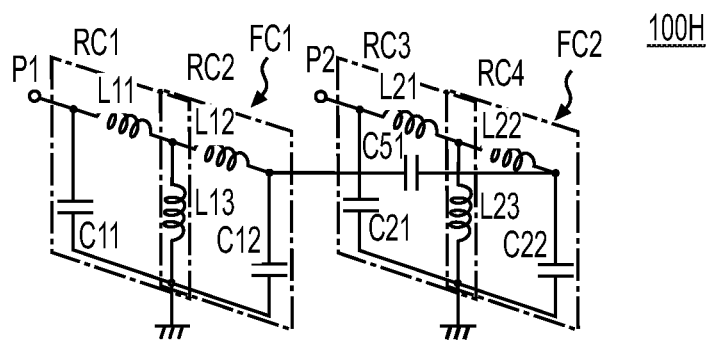
FIGS. 17A to 17D are equivalent circuit diagrams of band pass filters 100H to 100K of reference examples.
Figure 17B:
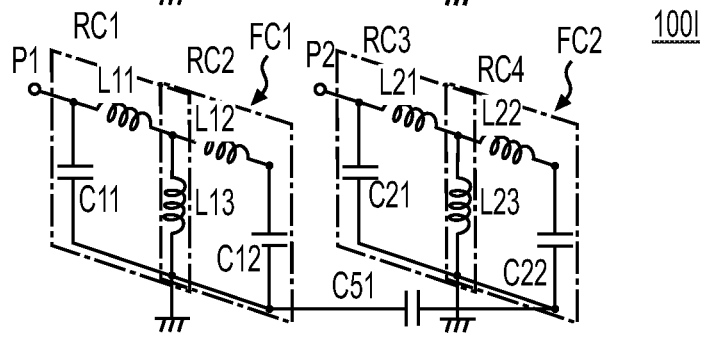
Figure 17C:
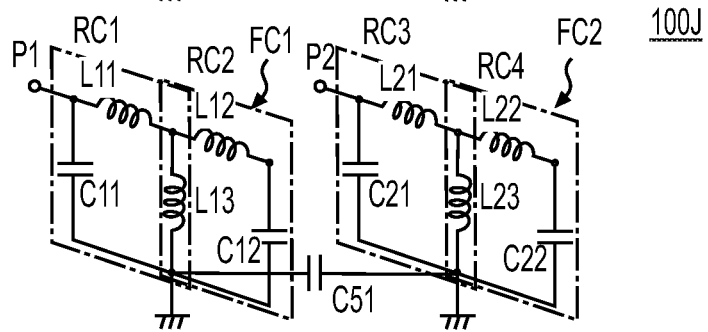
Figure 17D:
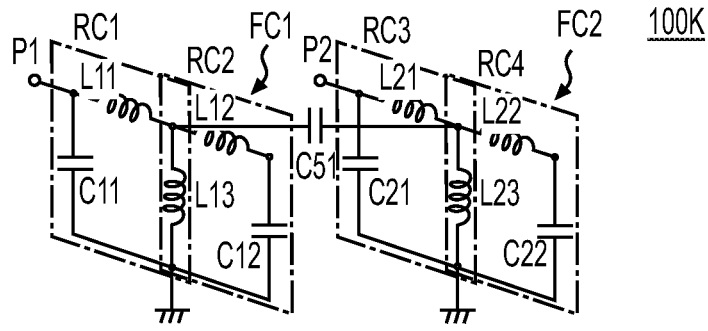

FIG. 17A is an equivalent circuit diagram of the band pass filter 100H. FIG. 17B is an equivalent circuit diagram of the band pass filter 100I. FIG. 17C is an equivalent circuit diagram of the band pass filter 100J. FIG. 17D is an equivalent circuit diagram of the band pass filter 100K.

Each of the band pass filters includes the first filter circuit FC1 and the second filter circuit FC2. The first filter circuit FC1 and the second filter circuit FC2 are the same as or similar to those of the band pass filter 100. Therefore, a further description thereof will be omitted here.

In each of the band pass filters, an eleventh capacitor C51 is coupled to the first filter circuit FC1 and the second filter circuit FC2. In the band pass filter 100H, the eleventh capacitor C51 is coupled between the second inductor L12 and the second capacitor C12, and between the fourth inductor L22 and the fourth capacitor C22.

In the band pass filter 100I, the eleventh capacitor C51 is coupled between the second capacitor C12 and the ground, and between the fourth capacitor C22 and the ground. In the band pass filter 100J, the eleventh capacitor C51 is coupled between the seventh inductor L13 and the ground, and between the eighth inductor L23 and the ground. In the band pass filter 100K, the eleventh capacitor C51 is coupled between the first inductor L11 and the second inductor L12, and between the third inductor L21 and the fourth inductor L22.

The coupling by the eleventh capacitor C51 may be either coupling by connection of a capacitor element or electric field coupling between elements of each resonant circuit.

In addition, similar to the band pass filter 100A, the first filter circuit FC1 may further include the ninth capacitor C13, and the second filter circuit FC2 may further include the tenth capacitor C23. The connection positions of the ninth capacitor C13 and the tenth capacitor C23 are as described above. Therefore, a further description thereof will be omitted here.

Figure 18:
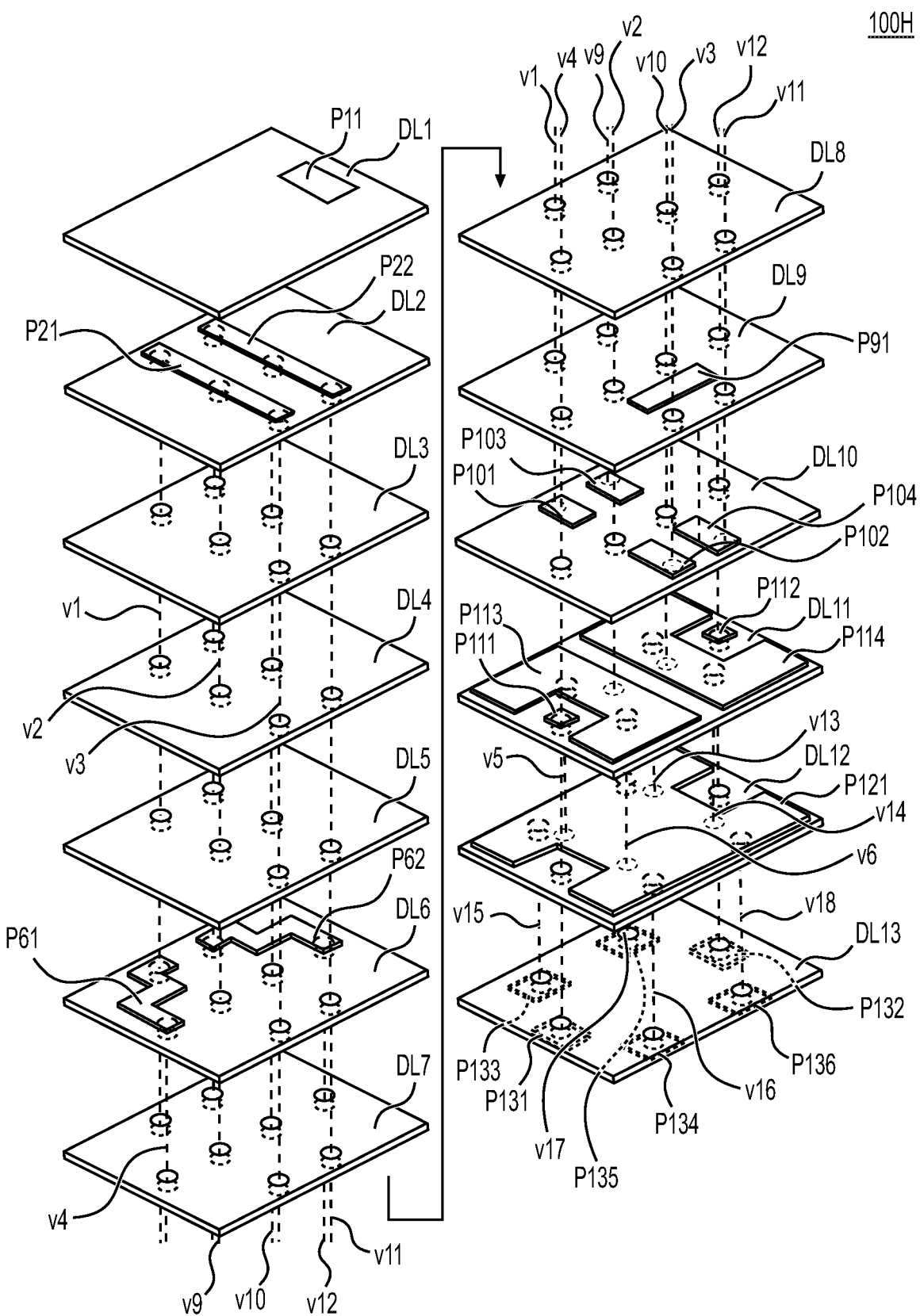
FIG. 18 is an exploded perspective view of the band pass filter 100H.

FIG. 18 is an exploded perspective view of the band pass filter 100H. Similarly to the band pass filter 100, the band pass filter 100H includes a multilayer body formed by laminating the dielectric layers DL1 to DL13, a plurality of pattern conductors, and a plurality of via conductors. The first filter circuit FC1, the second filter circuit FC2, and the eleventh capacitor C51 are defined by the dielectric layers, the pattern conductors, and the via conductors. Although the direction mark P11 is provided on the dielectric layer DL1 also in FIG. 18, this is not essential.

As described above, the second inductor L12 is defined by the pattern conductor P21 and the via conductors v2 and v3 formed in the dielectric layers DL2 to DL10. The via conductors v2 and v3 are electrically connected to other end portions of the pattern conductor P21. The second capacitor C12 is defined by the pattern conductors P102 and P113. The fourth inductor L22 is defined by the pattern conductor P22 and the via conductors v10 and v11 formed in the dielectric layers DL2 to DL10. The via conductors v10 and v11 are electrically connected to other end portions of the pattern conductor P22. The fourth capacitor C22 is defined by the pattern conductors P104 and P114.

The eleventh capacitor C51 is defined by a pattern conductor P91 formed on the dielectric layer DL9 and the pattern conductors P102 and P104 formed on the dielectric layer DL10. That is, the eleventh capacitor C51 is coupled between the second inductor L12 and the second capacitor C12, and between the fourth inductor L22 and the fourth capacitor C22 in the equivalent circuit diagram of FIG. 17(A).

The band pass filters 100I to 100K may be provided instead of the band pass filter 100H by changing a structure and layout of pattern conductors.

The preferred embodiments described herein are exemplary and the present invention is not limited to the above-described preferred embodiments and modifications, and various applications and modifications can be applied within the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A band pass filter comprising:
a first signal port and a second signal port; and
a first filter circuit, an intermediate circuit, and a second filter circuit, which are electrically connected between the first signal port and the second signal port; wherein
the first filter circuit includes a first resonant circuit and a second resonant circuit;
the first resonant circuit and the second resonant circuit include a first shared inductor which is mutually shared;
the first resonant circuit includes a first inductor, a first capacitor, and the first shared inductor;
the second resonant circuit includes a second inductor, a second capacitor, and the first shared inductor;
the second filter circuit includes a third resonant circuit and a fourth resonant circuit;
the third resonant circuit and the fourth resonant circuit include a second shared inductor which is mutually shared;
the third resonant circuit includes a third inductor, a third capacitor, and the second shared inductor;
the fourth resonant circuit includes a fourth inductor, a fourth capacitor, and the second shared inductor;
the intermediate circuit includes a first intermediate resonant circuit;
the first intermediate resonant circuit includes a fifth inductor and a fifth capacitor;
the first filter circuit and the intermediate circuit are electromagnetically coupled to each other, and the second filter circuit and the intermediate circuit are electromagnetically coupled to each other; and
in the first intermediate resonant circuit, one end of the fifth inductor is electrically connected to a ground through the fifth capacitor and another end of the fifth inductor is electrically connected to the ground, and the fifth inductor is electromagnetically coupled to each of the first inductor, the second inductor, the third inductor, and the fourth inductor.

2. The band pass filter according to claim 1, wherein
in the first resonant circuit, one end of the first inductor is electrically connected to a ground through the first capacitor, and another end of the first inductor is electrically connected to the ground through the first shared inductor;
in the second resonant circuit, one end of the second inductor is electrically connected to the ground through the second capacitor, and another end of the second inductor is electrically connected to the ground through the first shared inductor;
in the third resonant circuit, one end of the third inductor is electrically connected to the ground through the third capacitor, and another end of the third inductor is electrically connected to the ground through the second shared inductor; and
in the fourth resonant circuit, one end of the fourth inductor is electrically connected to the ground through the fourth capacitor, and another end of the fourth inductor is electrically connected to the ground through the second shared inductor.

3. The band pass filter according to claim 1, wherein the first filter circuit, the second filter circuit, and the intermediate circuit provide an attenuation pole at about −83 dB in a high frequency side relative to a pass band.

4. The band pass filter according to claim 1, wherein
the first intermediate resonant circuit further includes a sixth capacitor; and
in the first intermediate resonant circuit, the another end of the fifth inductor is electrically connected to the ground through the sixth capacitor.

5. The band pass filter according to claim 1, wherein the first filter circuit, the second filter circuit, and the intermediate circuit provide an attenuation pole at about −44 dB in a low frequency side relative to a pass band.

6. A band pass filter comprising:
a first signal port and a second signal port; and
a first filter circuit, an intermediate circuit, and a second filter circuit, which are electrically connected between the first signal port and the second signal port; wherein
the first filter circuit includes a first resonant circuit and a second resonant circuit;
the first resonant circuit and the second resonant circuit include a first shared inductor which is mutually shared;
the first resonant circuit includes a first inductor, a first capacitor, and the first shared inductor;
the second resonant circuit includes a second inductor, a second capacitor, and the first shared inductor;
the second filter circuit includes a third resonant circuit and a fourth resonant circuit;
the third resonant circuit and the fourth resonant circuit include a second shared inductor which is mutually shared;
the third resonant circuit includes a third inductor, a third capacitor, and the second shared inductor;
the fourth resonant circuit includes a fourth inductor, a fourth capacitor, and the second shared inductor;
the intermediate circuit includes a first intermediate resonant circuit;
the first intermediate resonant circuit includes a fifth inductor and a fifth capacitor;
the first filter circuit and the intermediate circuit are electromagnetically coupled to each other, and the second filter circuit and the intermediate circuit are electromagnetically coupled to each other;
in the first intermediate resonant circuit, one end of the fifth inductor is electrically connected to a ground through the fifth capacitor, and another end of the fifth inductor is electrically connected to the ground;
the intermediate circuit further includes a second intermediate resonant circuit;
the second intermediate resonant circuit includes a sixth inductor and a seventh capacitor;
in the second intermediate resonant circuit, one end of the sixth inductor is electrically connected to the ground through the seventh capacitor, and another end of the sixth inductor is electrically connected to the ground;
the fifth inductor is electromagnetically coupled to each of the first inductor and the second inductor;
the sixth inductor is electromagnetically coupled to each of the third inductor and the fourth inductor; and
the fifth inductor and the sixth inductor are electromagnetically coupled to each other.

7. The band pass filter according to claim 6, wherein
the first intermediate resonant circuit further includes a sixth capacitor;
in the first intermediate resonant circuit, the another end of the fifth inductor is electrically connected to the ground through the sixth capacitor;
the second intermediate resonant circuit further includes an eighth capacitor; and
in the second intermediate resonant circuit, the another end of the sixth inductor is electrically connected to the ground through the eighth capacitor.

8. The band pass filter according to claim 6, wherein
in the first resonant circuit, one end of the first inductor is electrically connected to a ground through the first capacitor, and another end of the first inductor is electrically connected to the ground through the first shared inductor;
in the second resonant circuit, one end of the second inductor is electrically connected to the ground through the second capacitor, and another end of the second inductor is electrically connected to the ground through the first shared inductor;
in the third resonant circuit, one end of the third inductor is electrically connected to the ground through the third capacitor, and another end of the third inductor is electrically connected to the ground through the second shared inductor; and
in the fourth resonant circuit, one end of the fourth inductor is electrically connected to the ground through the fourth capacitor, and another end of the fourth inductor is electrically connected to the ground through the second shared inductor.

9. A band pass filter comprising:
a multilayer body in which a plurality of dielectric layers are laminated and a plurality of conductors are included; and
a first filter circuit, a second filter circuit, and an intermediate circuit provided in the multilayer body wherein
the first filter circuit includes:
a ground conductor electrically connected to ground potential;
a first ground side capacitor electrode electrically connected to the ground conductor;
a first capacitor conductor and a second capacitor conductor that face the first ground side capacitor electrode;

a first shared inductor conductor including one end electrically connected to the first ground side capacitor electrode;
a first inductor conductor electrically connected to the first capacitor conductor and another end of the first shared inductor conductor; and
a second inductor conductor electrically connected to the second capacitor conductor and the another end of the first shared inductor conductor;
the second filter circuit includes:
the ground conductor;
a second ground side capacitor electrode electrically connected to the ground conductor;
a third capacitor conductor and a fourth capacitor conductor that face the second ground side capacitor electrode;
a second shared inductor conductor including one end electrically connected to the second ground side capacitor electrode;
a third inductor conductor electrically connected to the third capacitor conductor and another end of the second shared inductor conductor; and
a fourth inductor conductor electrically connected to the fourth capacitor conductor and the another end of the second shared inductor conductor;
the intermediate circuit includes:
the ground conductor;
a fifth capacitor conductor that faces the ground conductor; and
a fifth inductor conductor including one end is electrically connected to the fifth capacitor conductor and whose another end is electrically connected to the ground conductor;
the first filter circuit, the intermediate circuit, and the second filter circuit are provided side by side in this order in a direction orthogonal or substantially orthogonal to a lamination direction; and
the first filter circuit and the intermediate circuit are electromagnetically coupled to each other, and the second filter circuit and the intermediate circuit are electromagnetically coupled to each other.

10. The band pass filter according to claim 9, wherein, in the direction orthogonal or substantially orthogonal to the lamination direction, at least a portion of the first inductor conductor and at least a portion of the second inductor conductor overlap with the fifth inductor conductor, and at least a portion of the third inductor conductor and at least a portion of the fourth inductor conductor overlap with the fifth inductor conductor.

11. The band pass filter according to claim 10, wherein the intermediate circuit further includes a sixth capacitor conductor that faces the ground conductor; and
the another end of the fifth inductor conductor is electrically connected to the sixth capacitor conductor and is electrically connected to the ground conductor through a capacitor defined between the ground conductor and the sixth capacitor conductor.

12. The band pass filter according to claim 9, wherein the intermediate circuit further includes a sixth inductor conductor and a seventh capacitor conductor that face the ground conductor;
one end of the sixth inductor conductor is electrically connected to the seventh capacitor conductor and another end of the sixth inductor conductor is electrically connected to the ground conductor; and
in the direction orthogonal or substantially orthogonal to the lamination direction:
at least a portion of the first inductor conductor and at least a portion of the second inductor conductor overlap with the fifth inductor conductor;
at least a portion of the third inductor conductor and at least a portion of the fourth inductor conductor overlap with the sixth inductor conductor; and
at least a portion of the fifth inductor conductor and at least a portion of the sixth inductor conductor overlap with each other.

13. The band pass filter according to claim 12, wherein the intermediate circuit further includes a sixth capacitor conductor and an eighth capacitor conductor that face the ground conductor;
the another end of the fifth inductor conductor is electrically connected to the sixth capacitor conductor and is electrically connected to the ground conductor through a capacitor defined between the ground conductor and the sixth capacitor conductor; and
the another end of the sixth inductor conductor is electrically connected to the eighth capacitor conductor and is electrically connected to the ground conductor through a capacitor defined between the ground conductor and the eighth capacitor conductor.

14. The band pass filter according to claim 9, wherein the first ground side capacitor electrode faces the ground conductor and is electrically connected to the ground conductor through a capacitor defined between the first ground side capacitor electrode and the ground conductor; and
the second ground side capacitor electrode faces the ground conductor and is electrically connected to the ground conductor through a capacitor defined between the second ground side capacitor electrode and the ground conductor.

15. The band pass filter according to claim 9, wherein the first filter circuit, the second filter circuit, and the intermediate circuit are defined by the plurality of conductors and by via conductors that penetrate through the plurality of dielectric layers.

16. A band pass filter comprising:
a first signal port and a second signal port; and
a first filter circuit, an intermediate circuit, and a second filter circuit, which are electrically connected between the first signal port and the second signal port; wherein
the first filter circuit includes a first resonant circuit and a second resonant circuit;
the first resonant circuit and the second resonant circuit include a first shared inductor which is mutually shared;
the first resonant circuit includes a first inductor, a first capacitor, and the first shared inductor;
the second resonant circuit includes a second inductor, a second capacitor, and the first shared inductor;
the second filter circuit includes a third resonant circuit and a fourth resonant circuit;
the third resonant circuit and the fourth resonant circuit include a second shared inductor which is mutually shared;
the third resonant circuit includes a third inductor, a third capacitor, and the second shared inductor;
the fourth resonant circuit includes a fourth inductor, a fourth capacitor, and the second shared inductor;
the intermediate circuit includes a first intermediate resonant circuit;
the first intermediate resonant circuit includes a fifth inductor and a fifth capacitor;

the first filter circuit and the intermediate circuit are electromagnetically coupled to each other, and the second filter circuit and the intermediate circuit are electromagnetically coupled to each other;

in the first resonant circuit, the first inductor and the first shared inductor are electrically connected in series between the first signal port and a ground, and the first capacitor is electrically connected in parallel with the first inductor and the first shared inductor between the first signal port and the ground;

in the second resonant circuit, the second inductor and the second capacitor are electrically connected in series between the first inductor and the ground, and the first shared inductor is electrically connected in parallel with the second inductor and the second capacitor between the first inductor and the ground;

in the third resonant circuit, the third inductor and the second shared inductor are electrically connected in series between the second signal port and the ground, and the third capacitor is electrically connected in parallel with the third inductor and the second shared inductor between the second signal port and the ground; and in the fourth resonant circuit, the fourth inductor and the fourth capacitor are electrically connected in series between the third inductor and the ground, and the second shared inductor is electrically connected in parallel with the fourth inductor and the fourth capacitor between the third inductor and the ground.

17. A band pass filter comprising:

a first signal port and a second signal port; and a first filter circuit, an intermediate circuit, and a second filter circuit, which are electrically connected between the first signal port and the second signal port; wherein the first filter circuit includes a first resonant circuit and a second resonant circuit;

the first resonant circuit and the second resonant circuit include a first shared inductor which is mutually shared;

the first resonant circuit includes a first inductor, a first capacitor, and the first shared inductor;

the second resonant circuit includes a second inductor, a second capacitor, and the first shared inductor;

the second filter circuit includes a third resonant circuit and a fourth resonant circuit;

the third resonant circuit and the fourth resonant circuit include a second shared inductor which is mutually shared;

the third resonant circuit includes a third inductor, a third capacitor, and the second shared inductor;

the fourth resonant circuit includes a fourth inductor, a fourth capacitor, and the second shared inductor;

the intermediate circuit includes a first intermediate resonant circuit;

the first intermediate resonant circuit includes a fifth inductor and a fifth capacitor;

the first filter circuit and the intermediate circuit are electromagnetically coupled to each other, and the second filter circuit and the intermediate circuit are electromagnetically coupled to each other;

the first filter circuit further includes a ninth capacitor;

a connection point of the first capacitor, the second capacitor, and the first shared inductor is electrically connected to a ground through the ninth capacitor;

the second filter circuit further includes a tenth capacitor; and a connection point of the third capacitor, the fourth capacitor, and the second shared inductor is electrically connected to the ground through the tenth capacitor.

18. The band pass filter according to claim 17, wherein in the first resonant circuit, one end of the first inductor is electrically connected to a ground through the first capacitor, and another end of the first inductor is electrically connected to the ground through the first shared inductor;

in the second resonant circuit, one end of the second inductor is electrically connected to the ground through the second capacitor, and another end of the second inductor is electrically connected to the ground through the first shared inductor;

in the third resonant circuit, one end of the third inductor is electrically connected to the ground through the third capacitor, and another end of the third inductor is electrically connected to the ground through the second shared inductor; and in the fourth resonant circuit, one end of the fourth inductor is electrically connected to the ground through the fourth capacitor, and another end of the fourth inductor is electrically connected to the ground through the second shared inductor.

* * * * *